US012796522B2

(12) United States Patent
Fujibayashi et al.

(10) Patent No.: US 12,796,522 B2
(45) Date of Patent: Nov. 10, 2026

(54) SUBSTRATE BONDING SYSTEM AND METHOD FOR SUBSTRATE BONDING

(71) Applicant: Tokyo Electron Limited, Tokyo (JP)

(72) Inventors: Takashi Fujibayashi, Miyagi (JP); Kenji Ouchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 629 days.

(21) Appl. No.: 18/257,674

(22) PCT Filed: Dec. 13, 2021

(86) PCT No.: PCT/JP2021/045796
§ 371 (c)(1),
(2) Date: Jun. 15, 2023

(87) PCT Pub. No.: WO2022/138280
PCT Pub. Date: Jun. 30, 2022

(65) Prior Publication Data
US 2024/0014153 A1 Jan. 11, 2024

(30) Foreign Application Priority Data
Dec. 25, 2020 (JP) ................................ 2020-217832

(51) Int. Cl.
*H10W 72/90* (2026.01)
*H10W 72/00* (2026.01)
(Continued)

(52) U.S. Cl.
CPC ......... *H10W 72/90* (2026.01); *H10W 72/073* (2026.01); *H10W 72/01938* (2026.01);
(Continued)

(58) Field of Classification Search
None
See application file for complete search history.

(56) References Cited

U.S. PATENT DOCUMENTS 6,133,162 A 10/2000 Suzuki et al.
2004/0195965 A1* 10/2004 Yamazaki .......... H10K 59/8791 313/506
(Continued)

FOREIGN PATENT DOCUMENTS

JP H10-209045 8/1998
JP 2001-185515 7/2001
(Continued)

*Primary Examiner* — Michelle Mandala
(74) *Attorney, Agent, or Firm* — IPUSA, PLLC

(57) ABSTRACT

A substrate bonding system in one manner of the present disclosure includes a surface treatment module configured to perform plasma processing on a surface of a substrate. The substrate bonding system includes a deposition module coupled to the surface treatment module such that the substrate is transferred to the deposition module without being exposed to atmosphere, the deposition module being configured to perform a deposition process on the substrate on which the plasma processing is performed in the surface treatment module. The substrate bonding system includes a bonding module coupled to the deposition module such that the substrate is transferred to the bonding module without exposing the substrate to the atmosphere, the bonding module being configured to bond substrates on which the deposition process is performed in the deposition module, to form a bonded body.

21 Claims, 32 Drawing Sheets

1A

(51) Int. Cl.
*H10W 80/00* (2026.01)
*H10W 90/00* (2026.01)

(52) U.S. Cl.
CPC .... *H10W 72/01953* (2026.01); *H10W 80/041* (2026.01); *H10W 80/102* (2026.01); *H10W 80/165* (2026.01); *H10W 80/754* (2026.01); *H10W 90/792* (2026.01); *H10W 90/794* (2026.01)

(56) References Cited

U.S. PATENT DOCUMENTS

| | | | | |
|---|---|---|---|---|
| 2005/0003652 | A1* | 1/2005 | Ramanathan | H01L 25/50 257/E21.705 |
| 2006/0220197 | A1* | 10/2006 | Kobrinsky | H01L 25/50 257/E21.705 |
| 2019/0319007 | A1 | 10/2019 | Uzoh et al. | |
| 2020/0006057 | A1* | 1/2020 | Azumo | H01L 21/28562 |

FOREIGN PATENT DOCUMENTS

| | | |
|---|---|---|
| JP | 2016-021497 | 2/2016 |
| JP | 2017-511970 | 4/2017 |
| JP | 2017-152730 | 8/2017 |
| JP | 2018-195656 | 12/2018 |
| JP | 2020-002452 | 1/2020 |
| JP | 2020-192544 | 12/2020 |
| TW | 388079 | 4/2000 |
| WO | 2018/084285 | 5/2018 |
| WO | 2020/044579 | 3/2020 |
| WO | 2020/241047 | 12/2020 |

* cited by examiner

1B

1C

2C

3B

SUBSTRATE BONDING SYSTEM AND METHOD FOR SUBSTRATE BONDING

TECHNICAL FIELD

The present disclosure relates to a substrate bonding system and a method for substrate bonding.

BACKGROUND ART

When forming an electrode pad by chemical mechanical polishing, dishing (recess) may occur in which the central portion of the electrode pad is excessively etched to have a dish-like shape. If substrates are bonded to each other in a state in which dishing has occurred, the contact area between electrode pads becomes small, and thus contact resistance is increased. As one example of a method for increasing the contact area between the electrode pads, there are known techniques in which substrates are bonded after connection metals with planarized upper surfaces are formed on respective electrode pads disposed on different substrates (see, for example, Patent Document 1).

RELATED-ART DOCUMENT

Patent Document

[Patent document 1] Japanese Unexamined Patent Application Publication No. 2016-21497

SUMMARY

Problem to be Solved by the Invention

The present disclosure provides a technique capable of bonding lines with high reliability.

Means for Solving the Problem

A substrate bonding system in one manner of the present disclosure includes a surface treatment module configured to perform plasma processing on a surface of a substrate. The substrate bonding system includes a deposition module coupled to the surface treatment module such that the substrate is transferred to the deposition module without being exposed to atmosphere, the deposition module being configured to perform a deposition process on the substrate on which the plasma processing is performed in the surface treatment module. The substrate bonding system includes a bonding module coupled to the deposition module such that the substrate is transferred to the bonding module without exposing the substrate to the atmosphere, the bonding module being configured to bond substrates on which the deposition process is performed in the deposition module, to form a bonded body.

Effect of the Invention

According to the present disclosure, lines are enabled to be bonded together with high reliability.

DESCRIPTION OF EMBODIMENTS

Figure 1:
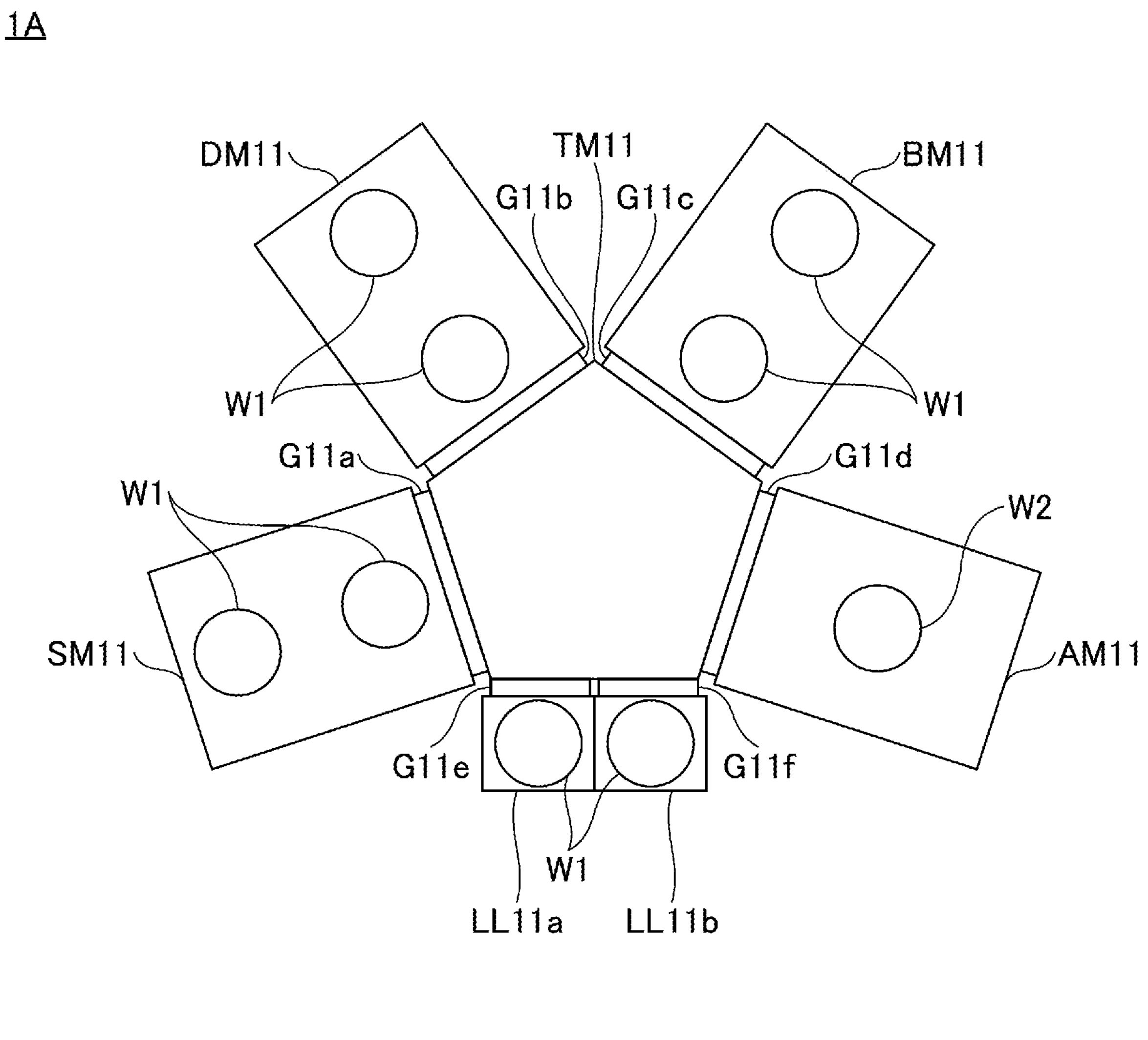
FIG. 1 is a diagram illustrating a first configuration example of a substrate bonding system according to a first embodiment.

Non-limiting exemplary embodiments of the present disclosure will be described below with reference to the accompanying drawings. In all of the accompanying drawings, the same or corresponding members or components are denoted by the same or corresponding reference numerals, and redundant description is omitted accordingly.

[Substrate Bonding]

When manufacturing a semiconductor device having a three-dimensional structure, hybrid bonding is used in which two substrates, each of which has a metal (electrode pad) and an insulating film on a surface of the substrate, after performing a line process (BEOL: Back End of Line), are prepared, and then metals are bonded together with insulating films of the two substrates. In the hybrid bonding, the surface of each substrate is planarized by chemical mechanical polishing (CMP) in the line process.

Figure 29A:
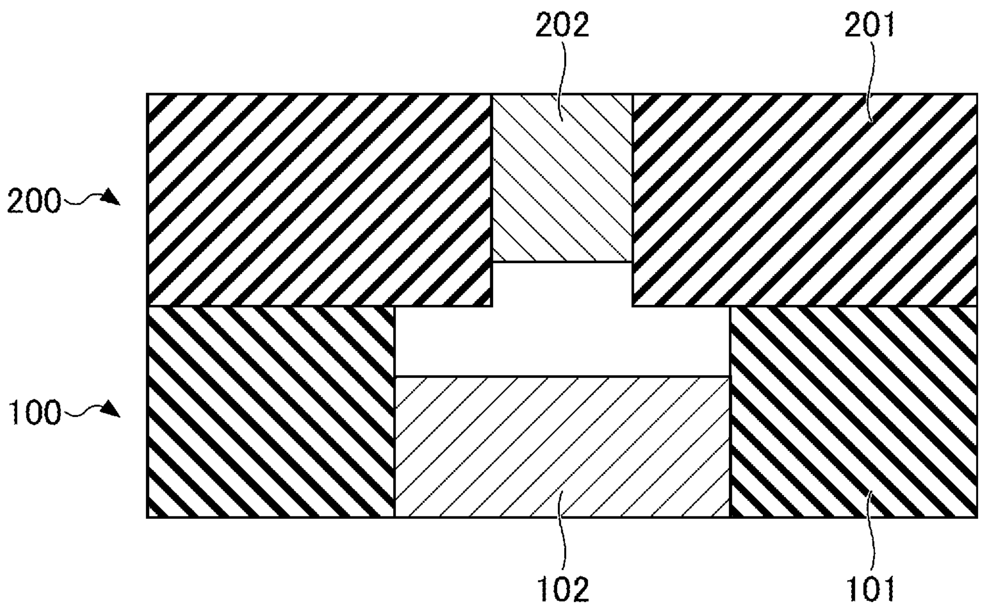
FIG. 29A is a diagram (1) for describing an interface surface between substrates.
Figure 29B:
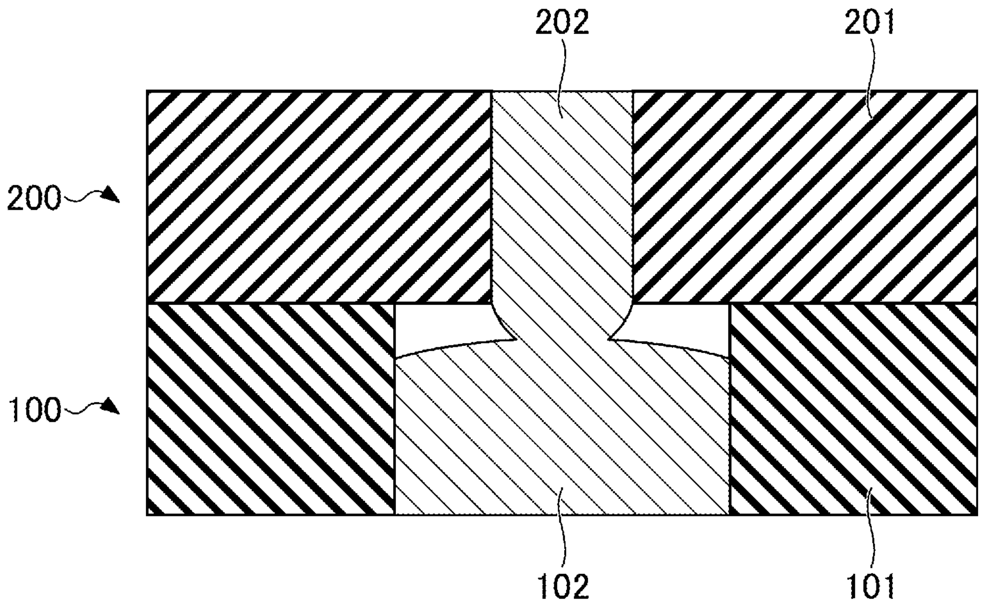
FIG. 29B is a diagram (1) for describing the interface surface between substrates.

In a planarization process by the CMP, as illustrated in FIG. 29A, there are cases where surfaces of metals 102 and 202 may be greatly recessed with respect to surfaces of insulating films 101 and 201 of substrates 100 and 200, respectively. In such a manner, if the substrate 100 and the substrate 200 are bonded to each other, the contact area between the metals becomes small even after the metals 102 and 202 expand due to heat treatment, as illustrated in FIG. 29B. Thus, contact resistance is increased, and bonding strength is reduced. As a result, reliability is reduced.

Figure 30A:
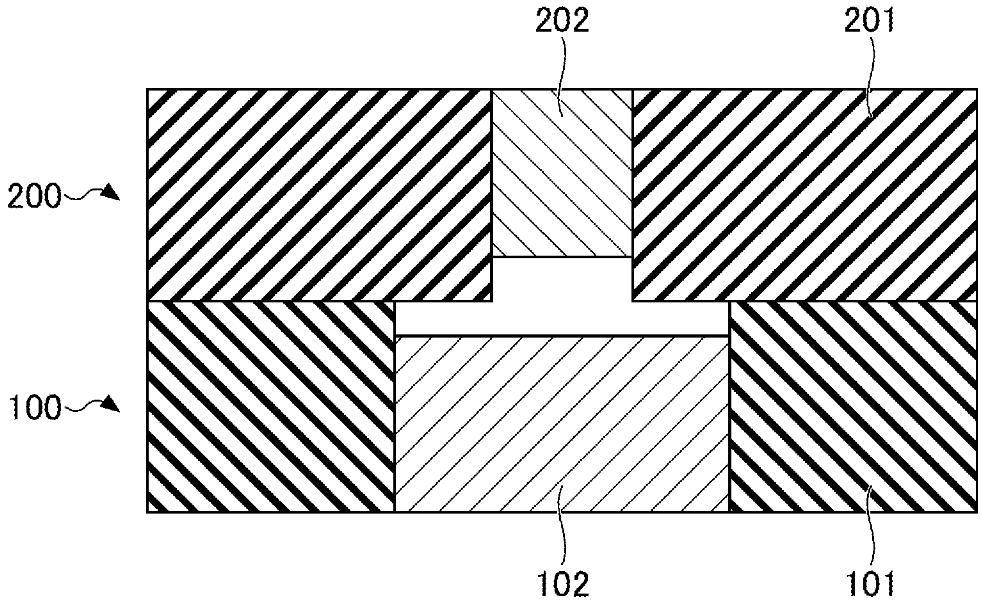
FIG. 30A is a diagram (2) for describing the interface surface between substrates.
Figure 30B:
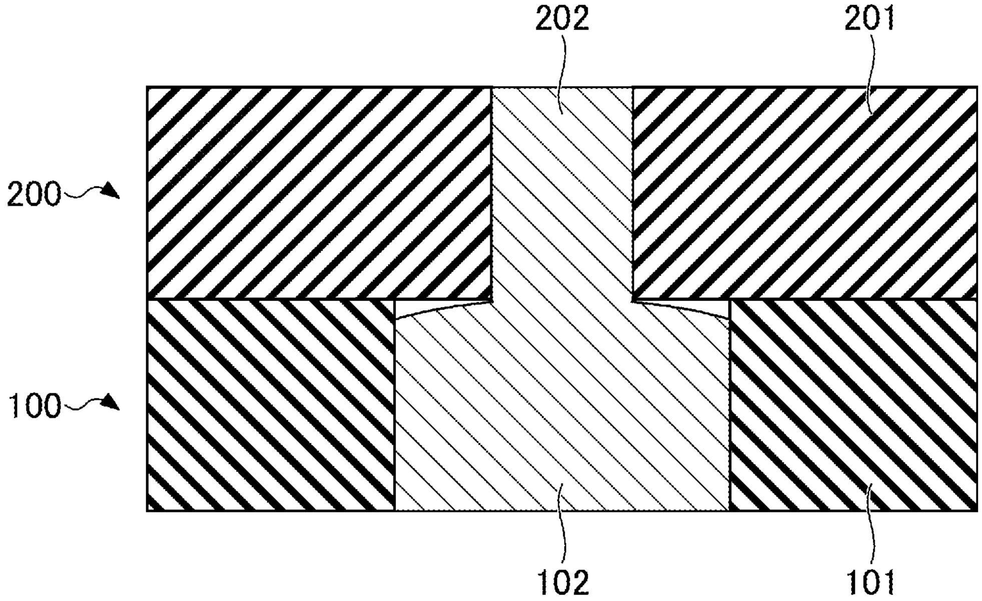
FIG. 30B is a diagram (2) for describing the interface between substrates.

Also, in the planarization process by the CMP, as illustrated in FIG. 30A, there are cases where the surfaces of the metals 102 and 202 may be slightly recessed with respect to the surfaces of the insulating films 101 and 201 of the substrate 100 and 200, respectively. In such a manner, if the substrate 100 and the substrate 200 are bonded together, the contact area between the metals is increased after the metals 102 and 202 expand due to heat treatment, as illustrated in FIG. 30B. Thus, contact resistance is reduced, and increased bonding strength is provided. As a result, reliability is improved.

However, in the planarization process by the CMP, it is difficult to control recess amounts of surfaces of the metals 102 and 202 with respect to the respective surfaces of the insulating films 101 and 201.

In the planarization process by the CMP, there are cases where dishing (recess) in which the central portion of the metal is excessively etched and thus has a dish shape may occur.

The outermost surface of the substrate after the CMP is processed with a corrosion inhibitor such as benzotriazole (BTA) in order to reduce corrosion or oxidation of the metal, but the corrosion inhibitor is removed by an etching solution such as an acid in the atmosphere, before bonding two substrates. With this approach, metal surfaces of the two substrates before bonding are each oxidized to form an oxide film. If bonding is performed in a state in which the oxide film is formed at an interface surface between the two substrates, minute defects (voids) are generated at the interface surface, and thus bonding strength is reduced. As a result, reliability is reduced. In addition, in the atmosphere, gases or the like are likely to be adsorbed on the interface surface between two substrates due to moisture or the like. If bonding is performed in a state in which the gases or the like are adsorbed on the interface surface between the two substrates, bubbles (voids) are generated at the interface surface, and thus bonding strength is reduced. As a result, reliability is reduced.

Hereinafter, a substrate bonding system and a method for substrate bonding that are capable of controlling a surface shape of the outermost surface of each substrate and thereby enabling lines to be bonded to each other with high reliability will be described.

First Embodiment (Substrate Bonding System)

A first configuration example of the substrate bonding system according to the first embodiment will be described with reference to FIG. 1. The substrate bonding system illustrated in FIG. 1 is a cluster system in which processing modules are arranged in a star shape around a vacuum transfer chamber, and is a system in which each substrate is vacuum-transferred between various processing modules by using the vacuum transfer chamber, and then two substrates are bonded after performing predetermined processes on the substrate.

As illustrated in FIG. 1, a substrate bonding system 1A includes a surface treatment module SM11, a deposition module DM11, a bonding module BM11, a heat treatment module AM11, a vacuum transfer chamber TM11, load lock chambers LL11*a* and LL11*b*, and the like.

The surface treatment module SM11 is coupled to the vacuum transfer chamber TM11 via a gate valve G11*a*. The interior of the surface treatment module SM11 is depressurized to a predetermined vacuum atmosphere. The surface treatment module SM11 accommodates, for example, two substrates W1 therein, and performs plasma processing on the surfaces of the two substrates W1 to remove contaminants, natural oxide films, and the like that are generated on the surfaces of the substrates W1. The plasma processing may include, for example, a process using radicals. Examples of the radicals include H radicals (H*) and NH radicals (NH*). The radicals are generated, for example, by supplying a gas for plasma formation to the surface treatment module SM11, and by activating the gas for plasma formation using a plasma formation apparatus. Examples of the gas for plasma formation include $H_2$, $NH_3$, and $CF_4$. The plasma processing may include a process using ion energy of plasma ions. Examples of the plasma ions include $N^+$, $Ar^+$, and $H^+$. The plasma ions are generated, for example, by supplying the gas for plasma formation to the surface treatment module SM11, and by activating the gas for plasma formation using a plasma formation apparatus. Examples of the gas for plasma formation include $N_2$, Ar, and $H_2$. The plasma processing may include, for example, a combination of a process using radicals and a process using ion energy of plasma ions. However, from the viewpoint of reducing damage to the substrate W1, the plasma processing preferably includes the process using radicals. Examples of the plasma formation apparatus include a microwave plasma apparatus, an inductively coupled plasma (ICP) apparatus, a capacitively coupled plasma (CCP) apparatus, and a surface wave plasma (SWP) apparatus.

The deposition module DM11 is coupled to the vacuum transfer chamber TM11 via a gate valve G11*b*. The interior of the deposition module DM11 is depressurized to a predetermined vacuum atmosphere. The deposition module DM11 accommodates, for example, the two substrates W1 therein, and performs a deposition process on the two substrates W1 to selectively deposit an insulating film in a predetermined region of each of the substrates W1. As described above, the deposition module DM11 is a processing module that selectively deposits the insulating film in the predetermined region, and is also referred to as a selective deposition module. An example of the insulating film includes a fluorine-added silicon oxide film (SiOF). The insulating film is deposited, for example, by atomic layer deposition (ALD) or chemical vapor deposition (CVD). Examples of the gas used in the ALD and the CVD include a process gas, such as $SiF_4$, $O_2$, or Ar, and a purge gas, such as $H_2$, Ar, or $N_2$. The process gas and the purge gas may be also activated using a plasma formation apparatus. Examples of the plasma formation apparatus include a microwave plasma apparatus, an ICP apparatus, a CCP apparatus, and a SWP apparatus.

The bonding module BM11 is coupled to the vacuum transfer chamber TM11 via a gate valve G11*c*. The interior of the bonding module BM11 is depressurized to a predetermined vacuum atmosphere. The bonding module BM11 bonds two substrates W1 to form a bonded body W2, by performing hybrid bonding in which electrodes are bonded together with insulating layers.

The heat treatment module AM11 is coupled to the vacuum transfer chamber TM11 via a gate valve G11*d*. The interior of the heat treatment module AM11 is depressurized to a predetermined vacuum atmosphere. The heat treatment module AM11 accommodates, for example, the bonded body W2 therein, and performs heat treatment of the bonded body W2, thereby increasing bonding strength of the two substrates W1 that constitute the bonded body W2. In the present embodiment, the heat treatment module AM11 includes, for example, a laser annealing apparatus or a lamp annealing apparatus.

The vacuum transfer chamber TM11 has a pentagonal shape in a plan view. The interior of the vacuum transfer chamber TM11 is depressurized to a predetermined vacuum atmosphere. A vacuum transfer robot (not illustrated) that is capable of transferring the substrates W1 and the bonded body W2 in a reduced pressure state is provided in the vacuum transfer chamber TM11. The vacuum transfer robot vacuum-transfers the substrates W1 between the surface treatment module SM11, the deposition module DM11, the bonding module BM11, the heat treatment module AM11, and the load lock chambers LL11*a* and LL11*b*. The vacuum transfer robot also vacuum-transfers the bonded body W2 between the heat treatment module AM11 and the load lock chambers LL11*a* and LL11*b*.

The load lock chambers LL11*a* and LL11*b* are coupled to the vacuum transfer chamber TM11 via gate valves G11*e* and G11*f*, respectively. The interior of each of the load lock chambers LL11*a* and LL11*b* can be switched between an ambient atmosphere and a vacuum atmosphere. Each of the load lock chambers LL11*a* and LL11*b* receives the substrate W1 from outside of the substrate bonding system 1A, and the received substrate W1 and the bonded body W2 are transferred to the outside of the substrate bonding system 1A.

Figure 2:
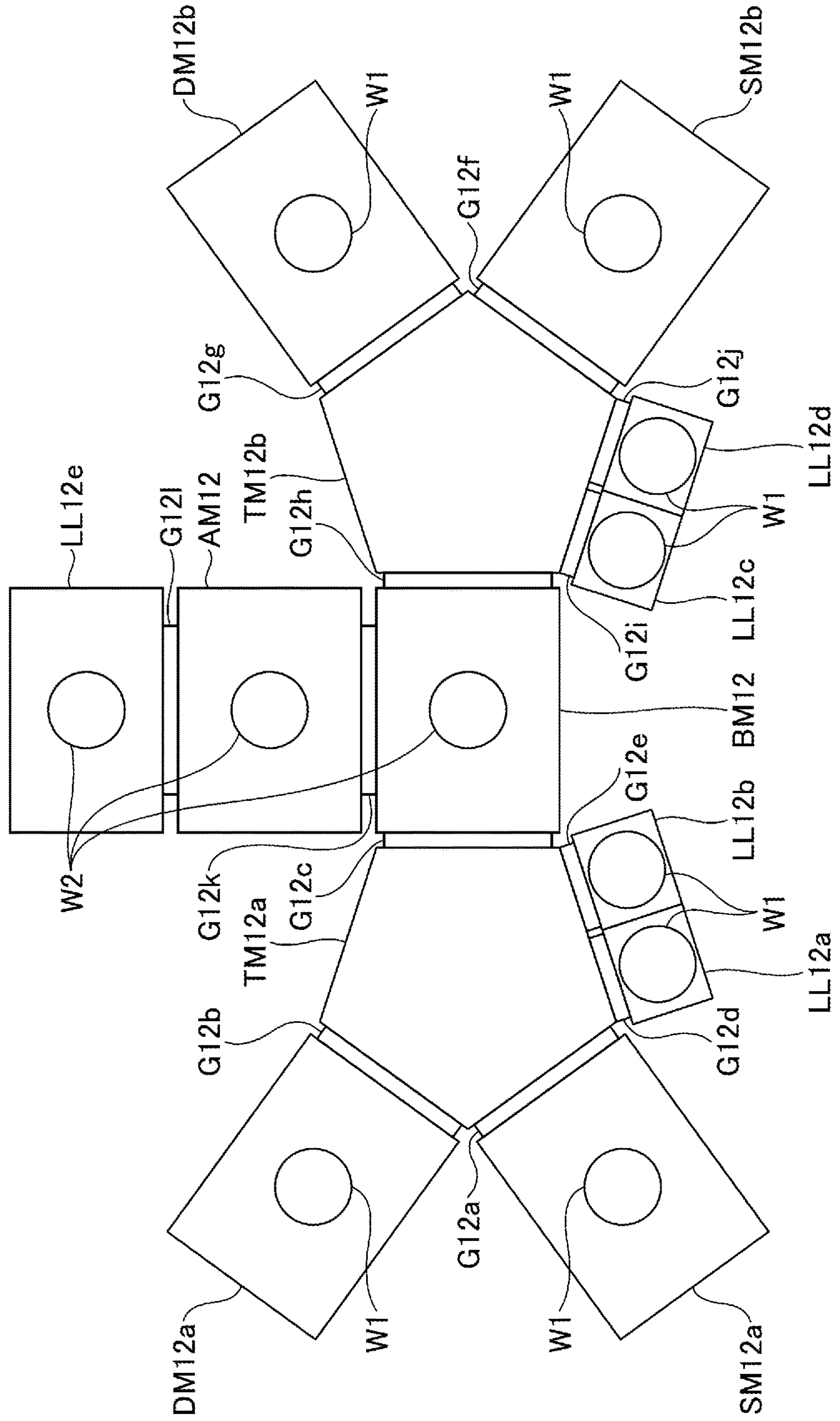
FIG. 2 is a diagram illustrating a second configuration example of the substrate bonding system of the first embodiment.

A second configuration example of the substrate bonding system according to the first embodiment will be described with reference to FIG. 2. The substrate bonding system illustrated in FIG. 2 is a cluster system in which processing modules are arranged in a star shape around a vacuum transfer chamber, and is a system in which a substrate is vacuum-transferred between various processing modules by using the vacuum transfer chamber, and then two substrates are bonded after performing predetermined processes on the substrate. In the substrate bonding system illustrated in FIG. 2, each processing module accommodates one substrate W1 therein, and performs a different process on the one substrate W1.

As illustrated in FIG. 2, a substrate bonding system 1B includes surface treatment modules SM12*a* and SM12*b*, deposition modules DM12*a* and DM12*b*, a bonding module BM12, a heat treatment module AM12, vacuum transfer chambers TM12*a* and TM12*b*, and load lock chambers LL12*a* to LL12*e*, and the like.

The surface treatment module SM12*a*, the deposition module DM12*a*, the bonding module BM12, and the load lock chambers LL12*a* and LL12*b* are coupled to the vacuum transfer chamber TM12*a* via gate valves G12*a* to G12*e*, respectively. The surface treatment module SM12*b*, the deposition module DM12*b*, the bonding module BM12, and load lock chambers LL12*c* and LL12*d* are coupled to the vacuum transfer chamber TM12*b* via gate valves G12*f* to G12*j*, respectively. The heat treatment module AM12 is coupled to the bonding module BM12 via a gate valve G12*k*, and is coupled to the load lock chamber LL12*e* via a gate valve G121.

The surface treatment modules SM12*a* and SM12*b* may have the same configuration as the surface treatment module SM11, except that each of the surface treatment modules SM12*a* and SM12*b* accommodates one substrate W1, and processes the substrate W1.

The deposition modules DM12*a* and DM12*b* may have the same configuration as the deposition module DM11, except that each of the deposition modules DM12*a* and DM12*b* accommodates one substrate W1, and processes the substrate W1.

The bonding module BM12 and the heat treatment module AM12 may have the same configurations as the bonding module BM11 and the heat treatment module AM11, respectively.

In the vacuum transfer chamber TM12*a*, a vacuum transfer robot vacuum-transfers the substrate W1 between the surface treatment module SM12*a*, the deposition module DM12*a*, the bonding module BM12, and the load lock chambers LL12*a* and LL12*b*. In the vacuum transfer chamber TM12*b*, a vacuum transfer robot vacuum-transfers the substrate W1 between the surface treatment module SM12*b*, the deposition module DM12*b*, the bonding module BM12, and the load lock chambers LL12*c* and LL12*d*.

The interior of each of the load lock chambers LL12*a* to LL12*e* can be switched between an ambient atmosphere and a vacuum atmosphere. Each of the load lock chambers LL12*a* to LL12*d* receives the substrate W1 from outside of the substrate bonding system 1B. In the load lock chamber LL12*e*, a bonded body W2 is transferred to the outside of the substrate bonding system 1B.

A third configuration example of the substrate bonding system according to the first embodiment will be described with reference to FIG. 3. The substrate bonding system illustrated in FIG. 3 is an in-line system in which processing modules are arranged in series, and is a system in which two substrates are bonded after each of the processing modules performs a predetermined process on the substrates without exposing the substrates to the atmosphere.

Figure 3:
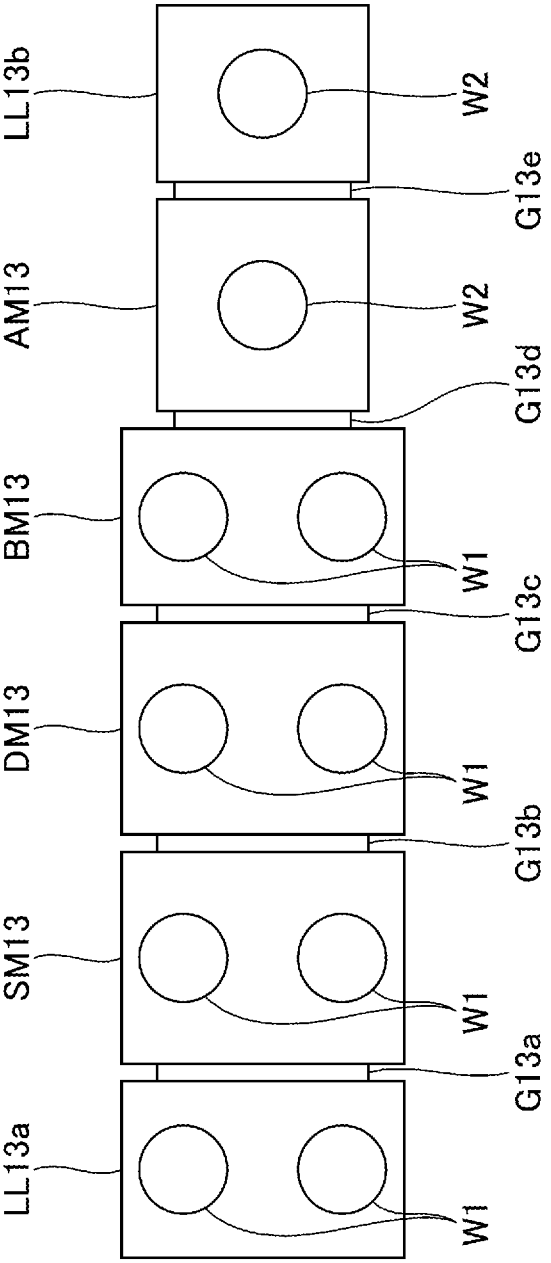
FIG. 3 is a diagram illustrating a third configuration example of the substrate bonding system according to the first embodiment.

As illustrated in FIG. 3, a substrate bonding system 1C includes load lock chambers LL13*a* and LL13*b*, a surface treatment module SM13, a deposition module DM13, a bonding module BM13, and a heat treatment module AM13, and the like.

The load lock chamber LL13*a*, the surface treatment module SM13, the deposition module DM13, the bonding module BM13, the heat treatment module AM13, and the load lock chamber LL13*b* are arranged in a line in this order.

The interior of the load lock chamber LL13*a* can be switched between an ambient atmosphere and a vacuum atmosphere. Substrates W1 are transferred to the load lock chamber LL13*a* from outside of the substrate bonding system 1C.

The surface treatment module SM13 is coupled to the load lock chamber LL13*a* via a gate valve G13*a*. The substrates W1 are vacuum-transferred from the load lock chamber LL13*a* to the surface treatment module SM13. The surface treatment module SM13 may have the same configuration as the surface treatment module SM11.

The deposition module DM13 is coupled to the surface treatment module SM13 via a gate valve G13*b*. The substrates W1 are vacuum-transferred from the surface treatment module SM13 to the deposition module DM13. The deposition module DM13 may have the same configuration as the deposition module DM11.

The bonding module BM13 is coupled to the deposition module DM13 via a gate valve G13*c*. The substrates W1 are vacuum-transferred from the deposition module DM13 to the bonding module BM13. The bonding module BM13 may have the same configuration as the bonding module BM11.

The heat treatment module AM13 is coupled to the bonding module BM13 via a gate valve G13*d*. A bonded body W2 is vacuum-transferred from the bonding module BM13 to the heat treatment module AM13. The heat treatment module AM13 may have the same configuration as the heat treatment module AM11.

The load lock chamber LL13*b* is coupled to the heat treatment module AM13 via a gate valve G13*e*. The bonded body W2 is vacuum-transferred from the heat treatment module AM13 to the load lock chamber LL13*b*. The interior of the load lock chamber LL13*b* can be switched between an ambient atmosphere and a vacuum atmosphere. In the load lock chamber LL13*b*, the bonded body W2 that is heat-treated at the heat treatment module AM13 is transferred to the outside of the substrate bonding system 1C.

A fourth configuration example of the substrate bonding system according to the first embodiment will be described with reference to FIG. 4. The substrate bonding system illustrated in FIG. 4 is an in-line system in which processing modules are arranged in series, and is a system in which substrates are bonded after each of the processing modules performs a predetermined process on a substrate without exposing the substrate to the atmosphere.

Figure 4:
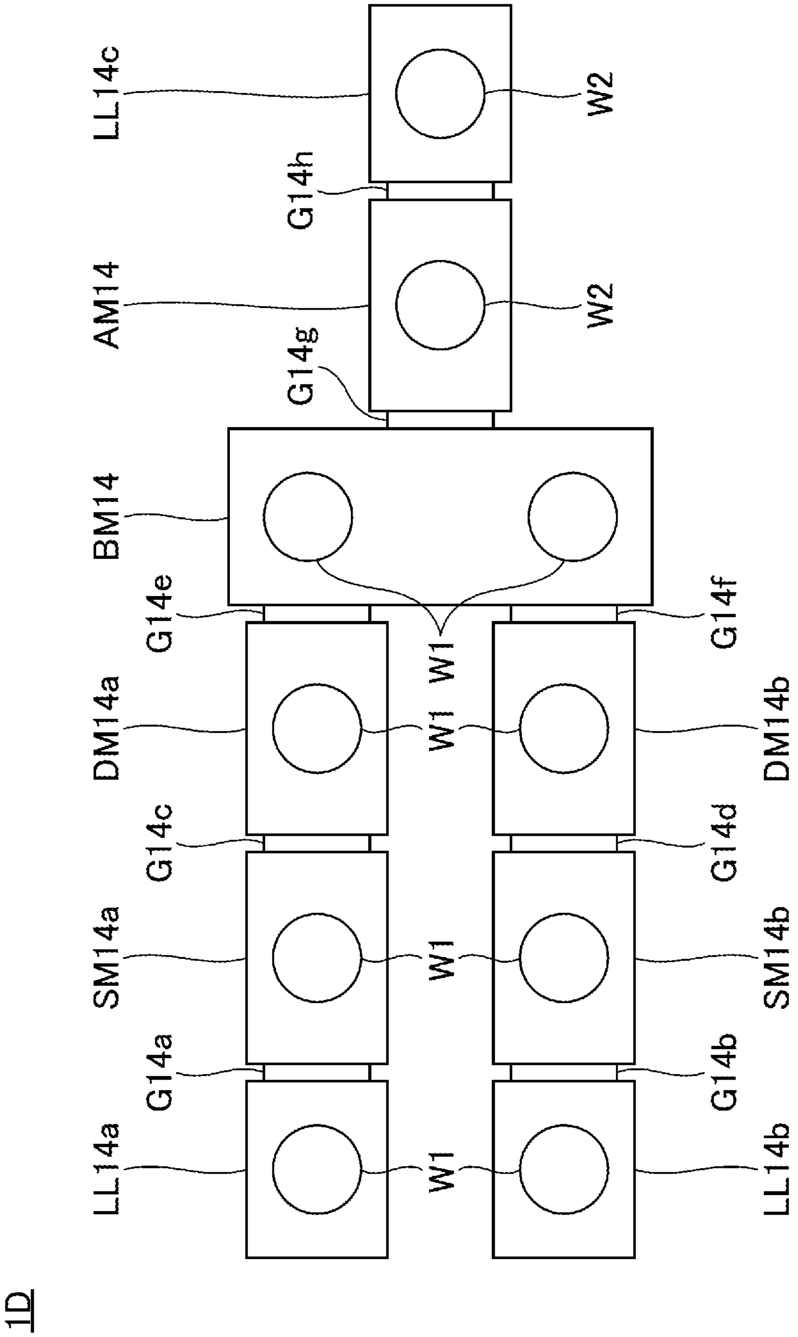
FIG. 4 is a diagram illustrating a fourth configuration example of the substrate bonding system according to the first embodiment.

As illustrated in FIG. 4, a substrate bonding system 1D includes load lock chambers LL14*a* to LL14*c*, surface treatment modules SM14*a* and SM14*b*, deposition modules DM14*a* and DM14*b*, a bonding module BM14, and a heat treatment module AM14, and the like.

The load lock chamber LL14*a*, the surface treatment module SM14*a*, and the deposition module DM14*a* are arranged in a line in this order, and the deposition module DM14*a* is coupled to the bonding module BM14. The load lock chamber LL14*b*, the surface treatment module SM14*b*, and the deposition module DM14*b* are arranged in a line in this order, and the deposition module DM14*b* is coupled to the bonding module BM14. The load lock chamber LL14*a*, the surface treatment module SM14*a*, and the deposition module DM14*a* are arranged in parallel with the load lock chamber LL14*b*, the surface treatment module SM14*b*, and the deposition module DM14*b*.

The interior of each of the load lock chambers LL14*a* and LL14*b* can be switched between an ambient atmosphere and a vacuum atmosphere. A substrate W1 is transferred to each of the load lock chambers LL14*a* and LL14*b* from outside of the substrate bonding system 1D.

The surface treatment modules SM14*a* and SM14*b* are coupled to the load lock chambers LL14*a* and LL14*b* via gate valves G14*a* and G14*b*, respectively. Substrates W1 are vacuum-transferred from the load lock chambers LL14*a* and LL14*b* to the surface treatment modules SM14*a* and SM14*b*, respectively. The surface treatment modules SM14*a* and SM14*b* may have the same configuration as the surface treatment modules SM12*a* and SM12*b*.

The deposition modules DM14*a* and DM14*b* are coupled to the surface treatment modules SM14*a* and SM14*b* via gate valves G14*c* and G14*d*, respectively. The substrates W1 are vacuum-transferred to the deposition modules DM14*a* and DM14*b* from the surface treatment modules SM14*a* and SM14*b*, respectively. The deposition modules DM14*a* and DM14*b* may have the same configuration as the deposition modules DM12*a* and DM12*b*.

The bonding module BM14 is coupled to the deposition modules DM14*a* and DM14*b* via respective gate valves G14*e* and G14*f*. The substrate W1 is vacuum-transferred from each of the deposition modules DM14*a* and DM14*b* to the bonding module BM14. The bonding module BM14 may have the same configuration as the bonding module BM12.

The heat treatment module AM14 is coupled to the bonding module BM14 via a gate valve G14*g*. A bonded body W2 is vacuum-transferred from the bonding module BM14 to the heat treatment module AM14. The heat treatment module AM14 may have the same configuration as the heat treatment module AM12.

The load lock chamber LL14*c* is coupled to the heat treatment module AM14 via a gate valve G14*h*. The bonded body W2 is vacuum-transferred from the heat treatment module AM14 to the load lock chamber LL14*c*. The load lock chamber LL14*c* may have the same configuration as the load lock chamber LL12*e*.

(Method for Substrate Bonding)

As an example of the method for substrate bonding according to the first embodiment, a case in which substrates are bonded by the substrate bonding system 1A illustrated in FIG. 1 will be described with reference to FIGS. 5A to 5C and FIGS. 6A to 6C. In each of the substrate bonding systems 1B to 1D illustrated in FIGS. 2 to 4, substrates can be bonded as in the substrate bonding system 1A.

Figure 5A:
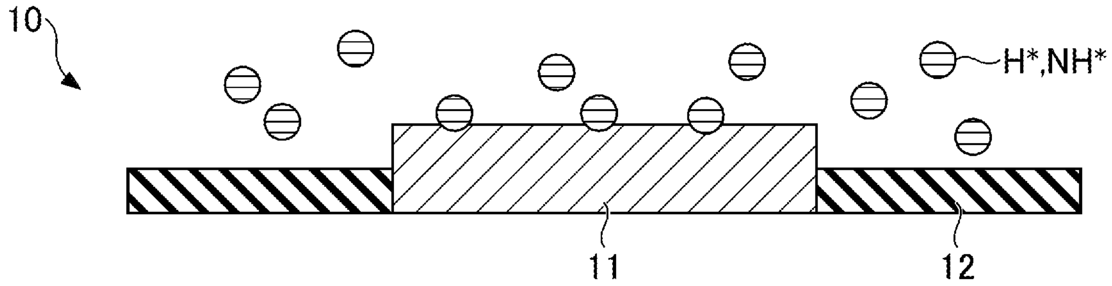
FIG. 5A is a cross-section view (1) illustrating an example of the method for substrate bonding according to the first embodiment.

Each substrate 10 is first prepared. In the present embodiment, the upper surface of the substrate 10 has a conductive layer 11 and an insulating layer 12, as illustrated in FIG. 5A. A step at which the upper surface of the conductive layer 11 is protruded from the upper surface of the insulating layer 12 is formed between the upper surface of the conductive layer 11 and the upper surface of the insulating layer 12. The conductive layer 11 is formed, for example, of copper (Cu). The conductive layer 11 may include, for example, a line or an electrode pad. The insulating layer 12 is formed, for example, of a low-dielectric-constant (low-k) material. The insulating layer 12 may include, for example, an interlayer dielectric film. A corrosion-inhibiting film (not illustrated) is formed on the substrate 10 as a protective film, so as to cover, for example, at least the upper surface of the conductive layer 11. The corrosion-inhibiting film is formed by CMP that uses a polishing slurry containing a corrosion inhibitor such as BTA (benzotriazole). The protective film need not be formed on the substrate 10.

Subsequently, the interior of each of the load lock chambers LL11*a* and LL11*b* is switched to the ambient atmosphere. Then, the prepared substrates 10 are transferred, for example, into the respective load lock chambers LL11*a* and LL11*b*. Then, the interior of each of the load lock chambers LL11*a* and LL11*b* that accommodates the substrate 10 is switched from the ambient atmosphere to the vacuum atmosphere. Subsequently, the gate valves G11*e*, G11*f*, and G11*a* are opened, the substrate 10 in each of the load lock chambers LL11*a* and LL11*b* is transferred to the surface treatment module SM11 through a vacuum transfer robot in the vacuum transfer chamber TM11, and then the gate valves G11*e* and G11*f*, and G11*a* are closed.

Subsequently, the plasma processing is performed on the surface of each substrate 10. With this approach, the upper surface of the conductive layer 11 and the upper surface of the insulating layer 12 are cleaned. In the present embodiment, as illustrated in FIG. 5A, within the surface treatment module SM11, the upper surface of the conductive layer 11 and the upper surface of the insulating layer 12 are exposed by supplying radicals such as H radicals (H*) or NH radicals (NH*) onto the substrate 10 and removing a contaminant, a natural oxide film, a corrosion-inhibiting film, or the like that is formed on the surface of the substrate 10.

Subsequently, the gate valves G11*a* and G11*b* are opened, substrates 10 that are processed within the surface treatment module SM11 are transferred to the deposition module DM11 through the vacuum transfer robot in the vacuum transfer chamber TM11, and then the gate valves G11*a* and G11*b* are closed.

Figure 5B:
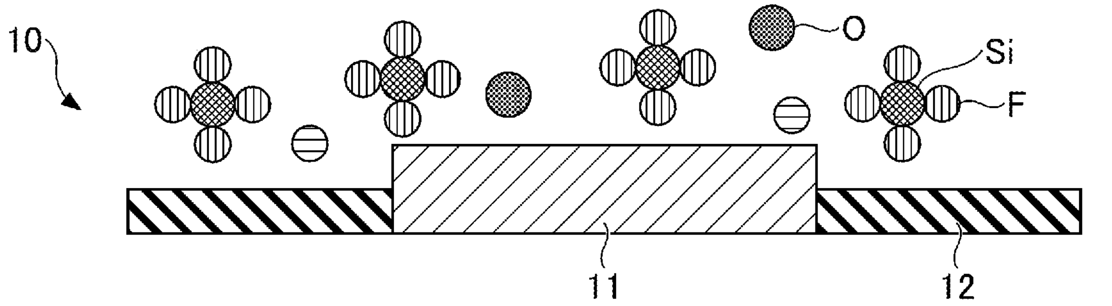
FIG. 5B is a cross-section view (1) illustrating an example of the method for substrate bonding according to the first embodiment.
Figure 5C:
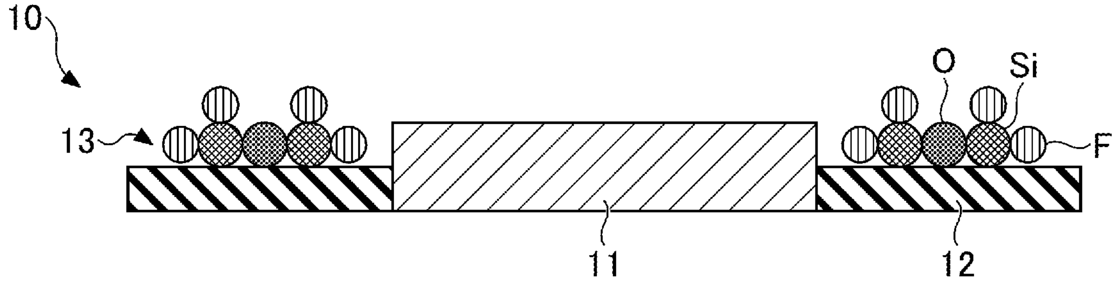
FIG. 5C is a cross-section view (1) illustrating an example of the method for substrate bonding according to the first embodiment.

Subsequently, a deposition process is performed on the substrates 10 on which plasma processing is performed in the surface treatment module SM11, to selectively deposit the insulating film 13 on the cleaned surface of each of respective insulating layers 12. In the present embodiment, as illustrated in FIG. 5B, a process gas such as $SiF_4$, $O_2$, or Ar is supplied onto the substrate 10 within the deposition module DM11. The process gas may be also activated using a plasma formation apparatus. In addition, as illustrated in FIG. 5C, a purge gas such as $H_2$, Ar, or $N_2$ is supplied onto the substrate 10 within the deposition module DM11. The purge gas may be also activated using a plasma formation apparatus. In such a manner, by repeating the supply of the process gas, and the supply of the purge gas, onto the substrate 10, the insulating film 13 is selectively deposited on an exposed surface of the insulating layer 12. The insulating film 13 includes, for example, $SiO_2$. At this time, the surface shape of the outermost surface of each substrate 10 can be controlled by changing the number of repetitions for the supply of the process gas and the supply of the purge gas. For example, by increasing the number of repetitions, a film thickness of the insulating film 13 formed on the exposed surface of the insulating layer 12 is increased, and thus the step on the outermost surface of the substrate 10 is reduced. The number of repetitions is set, for example, in accordance with a thermal expansion coefficient of a material that constitutes the conductive layer 11, a thermal expansion coefficient of a material that constitutes the insulating layer 12, and a temperature for the heat treatment described below.

Subsequently, the gate valves G11*b* and G11*c* are opened, the substrates 10 that are processed within the deposition module DM11 are transferred to the bonding module BM11 through the vacuum transfer robot in the vacuum transfer chamber TM11, and then the gate valves G11*b* and G11*c* are closed.

Figure 6A:
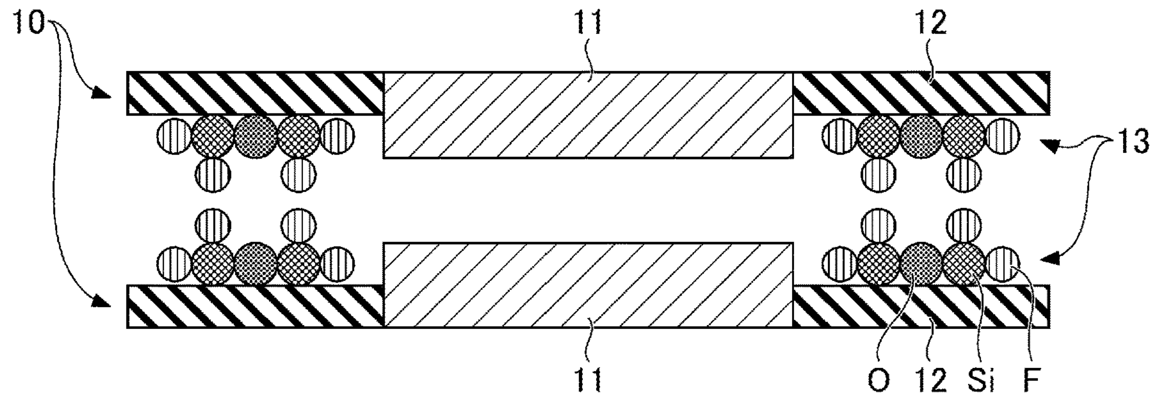
FIG. 6A is a cross-section view (2) illustrating an example of the method for substrate bonding according to the first embodiment.
Figure 6B:
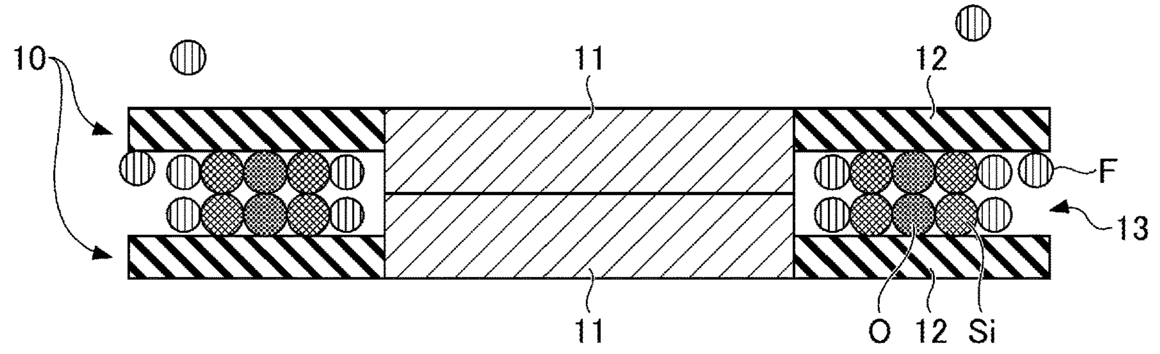
FIG. 6B is a cross-section view (2) illustrating an example of the method for substrate bonding according to the first embodiment.

Subsequently, the substrates 10 on which the deposition process is performed in the deposition module DM11 are bonded to form a bonded body 10X. In the present embodiment, as illustrated in FIG. 6A, within the bonding module BM11, the conductive layer 11 and the insulating layer 12 (insulating film 13) of one substrate 10 are respectively positioned with respect to the conductive layer 11 and the insulating layer 12 (insulating film 13) of the other substrate 10. After the positioning, two substrates 10 are bonded as illustrated in FIG. 6B to form the bonded body 10X.

Subsequently, the gate valves G11*c* and G11*d* are opened, the bonded body 10X that is obtained within the bonding module BM11 is transferred to the heat treatment module AM11 by the vacuum transfer robot in the vacuum transfer chamber TM11, and then the gate valves G11*c* and Gild are closed.

Figure 6C:
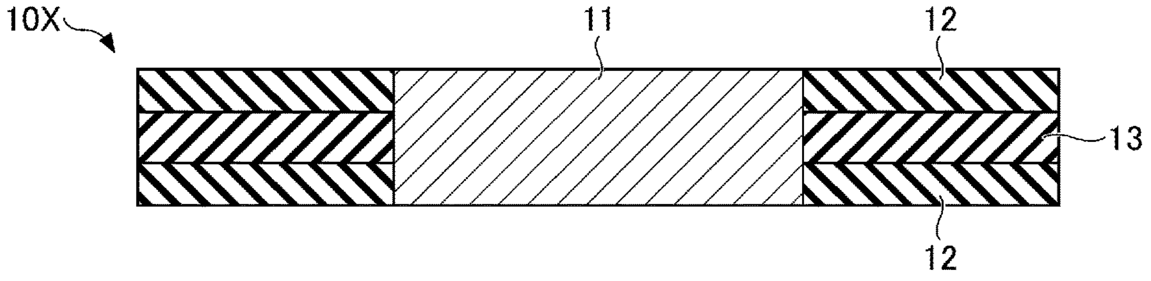
FIG. 6C is a cross-section view (2) illustrating an example of the method for substrate bonding according to the first embodiment.

Subsequently, the bonded body 10X formed in the bonding module BM11 is heat-treated. In the present embodiment, as illustrated in FIG. 6C, bonding strength of two substrates 10 that constitute the bonded body 10X is increased by heat-treating the bonded body 10X within the heat treatment module AM11.

Subsequently, the gate valves Gild and G11*f* are opened, the bonded body 10X heat-treated within the heat treatment module AM11 is transferred, for example, to the load-lock chamber LL11*b* through the vacuum transfer robot in the vacuum transfer chamber TM11, and then the gate valves Gild and G11*f* are closed. The load lock chamber LL11*a* may be used instead of the load lock chamber LL11*b*.

Subsequently, the interior of the load lock chamber LL11*b* is switched from the vacuum atmosphere to the ambient atmosphere, and the bonded body 10X is transferred from the interior of the load lock chamber LL11*a* to the outside of the substrate bonding system 1A.

According to the first embodiment described above, the upper surface of the conductive layer 11 and the upper surface of the insulating layer 12 are cleaned by performing plasma processing on the surface of each substrate 10. Then, the insulating film 13 is selectively deposited on the cleaned surface of the insulating layer 12 to control a surface shape. Then, two substrates 10 are bonded to form the bonded body 10X by performing hybrid bonding in which conductive layers 11 are bonded together with insulating layers 12 (insulating films 13) in a state where given surface shapes are controlled. With this approach, the contact area between the conductive layers 11 can be increased. As a result, contact resistance is reduced, and bonding strength is improved. That is, the conductive layers 11 can be bonded with high reliability.

Also, according to the first embodiment, the plasma processing in the surface treatment module, the selective deposition process in the deposition module, and the bonding process in the bonding module are continuously performed in this order without exposing each substrate 10 to the atmosphere. With this approach, contamination of the substrate 10, and oxidation and the like of the surface of the conductive layer 11, during transfer between modules can be reduced. As a result, generation of fine defects (voids) caused by a contaminant or an oxide film at the interface surface of the bonded body 10X is reduced, and thus bonding strength is improved.

Also, according to the first embodiment, the bonded body 10X is transferred from the bonding module to the heat treatment module without being exposed to the atmosphere, and is heat-treated after the bonding process. With this approach, productivity is improved and bonding strength is improved, in comparison to a case where the bonded body 10X is heat-treated outside the substrate bonding system.

Second Embodiment (Substrate Bonding System)

A first configuration example of the substrate bonding system according to the second embodiment will be described with reference to FIG. 7. The substrate bonding system illustrated in FIG. 7 is a cluster system in which processing modules are arranged in a star shape around a vacuum transfer chamber, and is a system in which substrates are vacuum-transferred between various processing modules by using the vacuum transfer chamber, and then two substrates are bonded after performing predetermined processes on the substrates.

Figure 7:
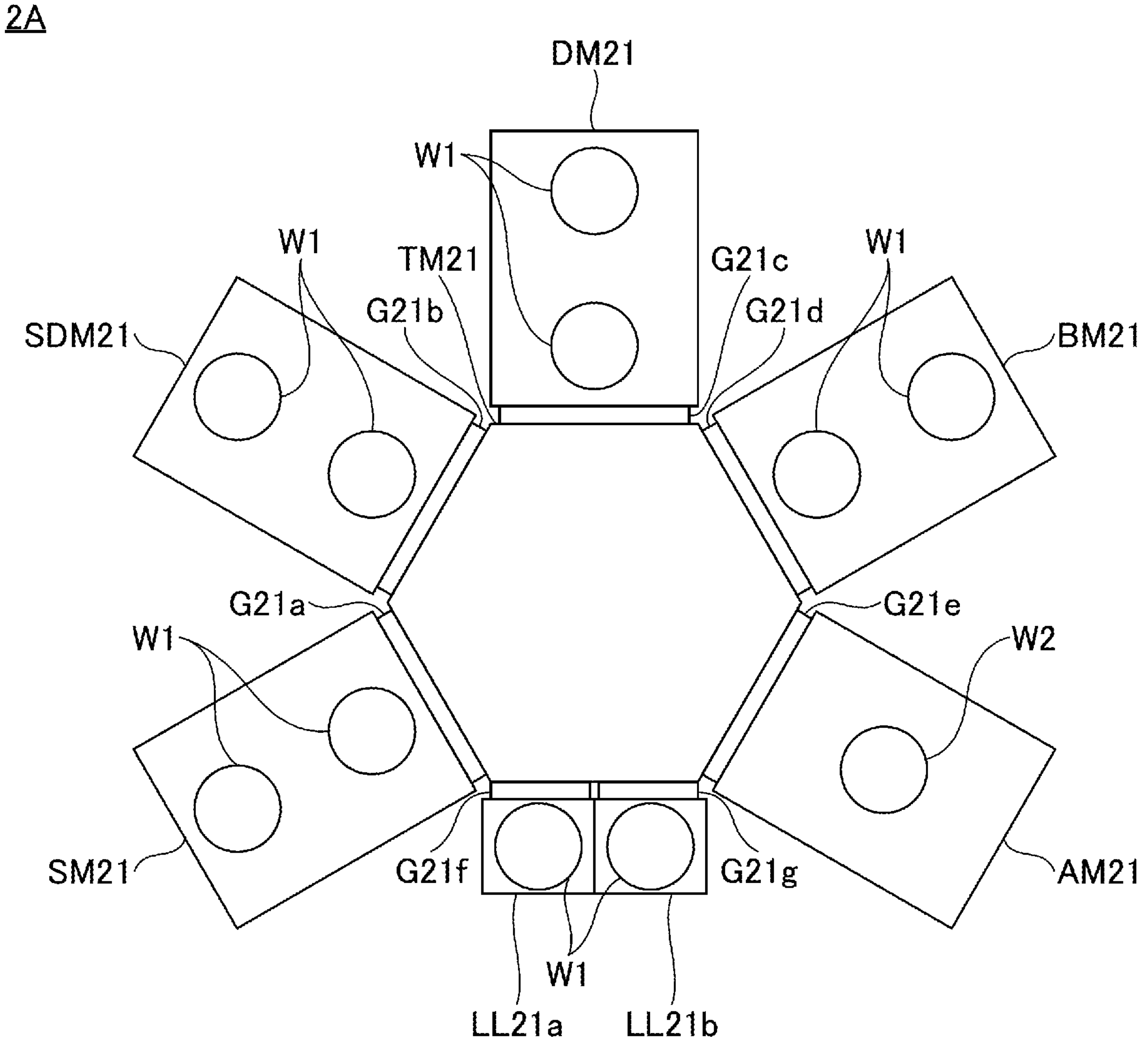
FIG. 7 is a diagram illustrating a first configuration example of the substrate bonding system according to a second embodiment.

As illustrated in FIG. 7, a substrate bonding system 2A includes a surface treatment module SM21, a SAM deposition module SDM21, a deposition module DM21, a bonding module BM21, a heat treatment module AM21, a vacuum transfer chamber TM21, load lock chambers LL21*a* and LL21*b*, and the like.

The surface treatment module SM21, the SAM deposition module SDM21, the deposition module DM21, the bonding module BM21, and the heat treatment module AM21 are coupled to the vacuum transfer chamber TM21 via gate valves G21*a* to G21*e*, respectively. The load lock chambers LL21*a* and LL21*b* are coupled to the vacuum transfer chamber TM21 via gate valves G21*f* and G21*g*, respectively.

The surface treatment module SM21, the bonding module BM21, the heat treatment module AM21, the vacuum transfer chamber TM21, and the load lock chambers LL21*a* and LL21*b* may have the same configurations as the surface treatment module SM11, the bonding module BM11, the heat treatment module AM11, the vacuum transfer chamber TM11, and the load lock chambers LL11*a* and LL11*b* of the substrate bonding system 1A illustrated in FIG. 1, respectively.

The interior of the SAM deposition module SDM21 is depressurized to a predetermined vacuum atmosphere. The SAM deposition module SDM21 accommodates, for example, two substrates W1 therein, and deposits a self-assembled monolayer film (SAM) on each of two substrates W1. In the present embodiment, the SAM deposition module SDM21 is a module that deposits a SAM on each substrate W1, for example, by vapor deposition, molecular layer deposition (MLD), or the like. In the present embodiment, the SAM is formed of a conductive material. However, the SAM may be formed of an insulating material.

The interior of the deposition module DM21 is depressurized to a predetermined vacuum atmosphere. The deposition module DM21 accommodates, for example, two substrates W1 therein, and performs a deposition process on the two substrates W1 to selectively deposit an insulating film in a predetermined region of each substrate W1. As described above, the deposition module DM21 is a processing module that selectively deposits the insulating film in the predetermined region, and is also referred to as a selective deposition module. The insulating film may include, for example, an aluminum oxide film ($Al_2O_3$). The insulating film is deposited, for example, by ALD or CVD. Examples of the gas used in the ALD or the CVD include a process gas, such as $Al(CH_3)$ or $H_2O$, and a purge gas, such as $H_2$, Ar, or $N_2$. The process gas and the purge gas may be activated using a plasma formation apparatus. Examples of the plasma formation apparatus include a microwave plasma apparatus, an ICP apparatus, a CCP apparatus, and a SWP apparatus.

Figure 8:
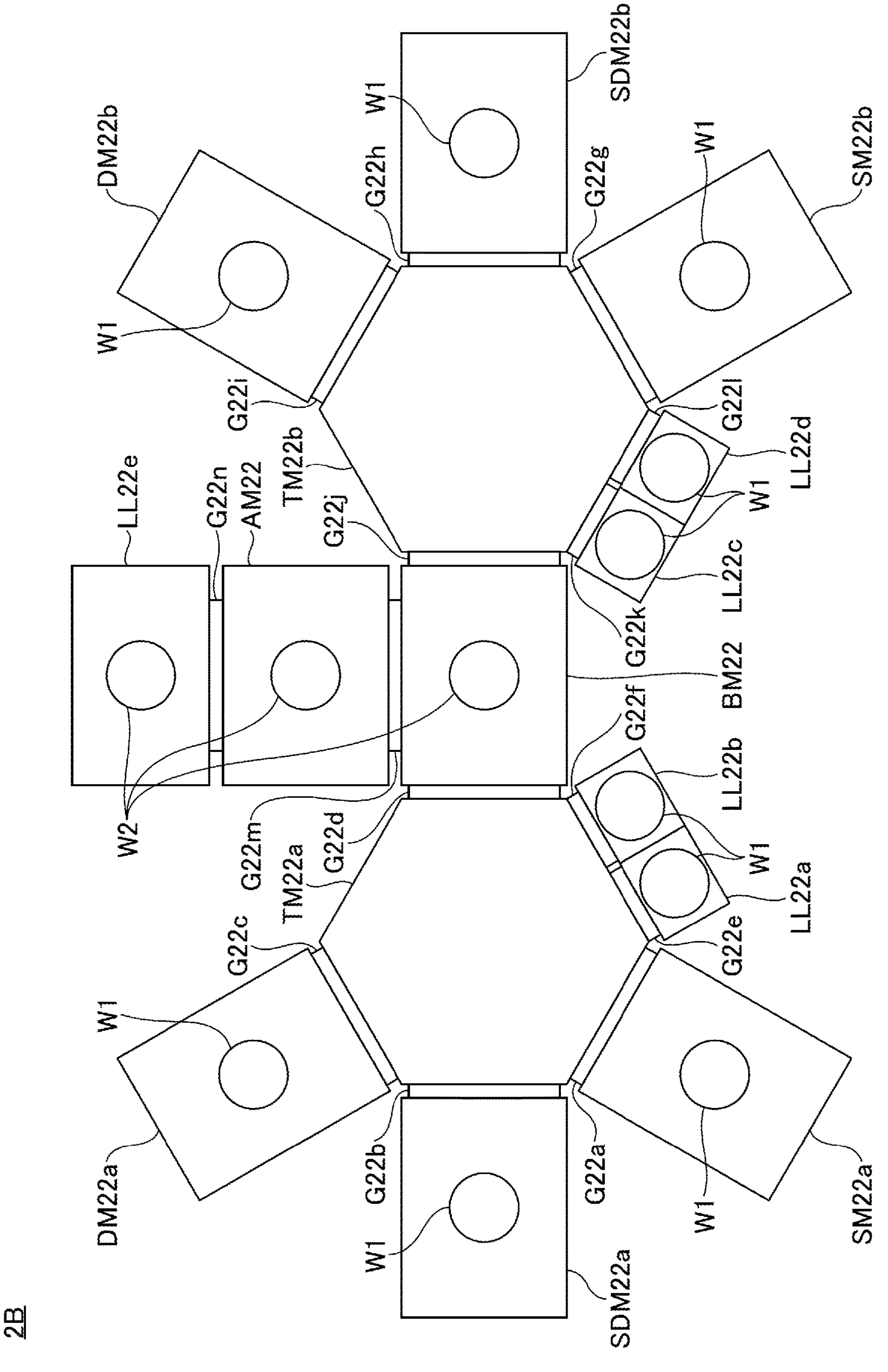
FIG. 8 is a diagram illustrating a second configuration example of the substrate bonding system according to the second embodiment.

A second configuration example of the substrate bonding system according to the second embodiment will be described with reference to FIG. 8. The substrate bonding system illustrated in FIG. 8 is a cluster system in which processing modules are arranged in a star shape around a vacuum transfer chamber, and is a system in which each substrate is vacuum-transferred between various processing modules by using the vacuum transfer chamber, and then two substrates are bonded after performing predetermined processes on the substrate. In the substrate bonding system illustrated in FIG. 8, each processing module accommodates one substrate W1 therein, and performs a different process on the one substrate W1.

As illustrated in FIG. 8, a substrate bonding system 2B includes surface treatment modules SM22*a* and SM22*b*, SAM deposition modules SDM22*a* and SDM22*b*, deposition modules DM22*a* and DM22*b*, a bonding module BM22, a heat treatment module AM22, vacuum transfer chambers TM22*a* and TM22*b*, and load lock chambers LL22*a* to LL22*e*, and the like.

The surface treatment module SM22*a*, the SAM deposition module SDM22*a*, the deposition module DM22*a*, the bonding module BM22, and the load lock chambers LL22*a* and LL22*b* are coupled to the vacuum transfer chamber TM22*a* via gate valves G22*a* to G22*f*, respectively. The surface treatment module SM22*b*, the SAM deposition module SDM22*b*, the deposition module DM22*b*, the bonding module BM22, and the load lock chambers LL22*c* and LL22*d* are coupled to the vacuum transfer chamber TM22*b* via gate valves G22*g* to G221, respectively. The heat treatment module AM22 is coupled to the bonding module BM22 via a gate valve G22*m*, and is coupled to the load lock chamber LL22*e* via a gate valve G22*n*.

The surface treatment modules SM22*a* and SM22*b* may have the same configuration as the surface treatment modules SM12*a* and SM12*b*.

Each of the SAM deposition modules SDM22*a* and SDM22*b* may have the same configuration as the SAM deposition module SDM21, except that each of the SAM deposition modules SDM22*a* and SDM22*b* accommodates one substrate W1 therein, and performs a process on the substrate.

The deposition modules DM22*a* and DM22*b* may have the same configuration as the deposition modules DM12*a* and DM12*b*.

The bonding module BM22 and the heat treatment module AM22 may have the same configurations as the bonding module BM12 and the heat treatment module AM12, respectively.

In the vacuum transfer chamber TM22*a*, a vacuum transfer robot vacuum-transfers the substrate W1 between the surface treatment module SM22*a*, the SAM deposition module SDM22*a*, the deposition module DM22*a*, the bonding module BM22, and the load lock chambers LL22*a* and LL22*b*. In the vacuum transfer chamber TM22*b*, a vacuum transfer robot vacuum-transfers the substrate W1 between the surface treatment module SM22*b*, the SAM deposition module SDM22*b*, the deposition module DM22*b*, the bonding module BM22, and the load lock chambers LL22*c* and LL22*d*.

The load lock chambers LL22*a* to LL22*e* may have the same configuration as the load lock chambers LL12*a* to LL12*e*.

A third configuration example of the substrate bonding system according to the second embodiment will be described with reference to FIG. 9. The substrate bonding system illustrated in FIG. 9 is an in-line system in which processing modules are arranged in series, and is a system in which two substrates are bonded after each of the processing modules performs a predetermined process on the substrates without exposing the substrates to the atmosphere.

Figure 9:
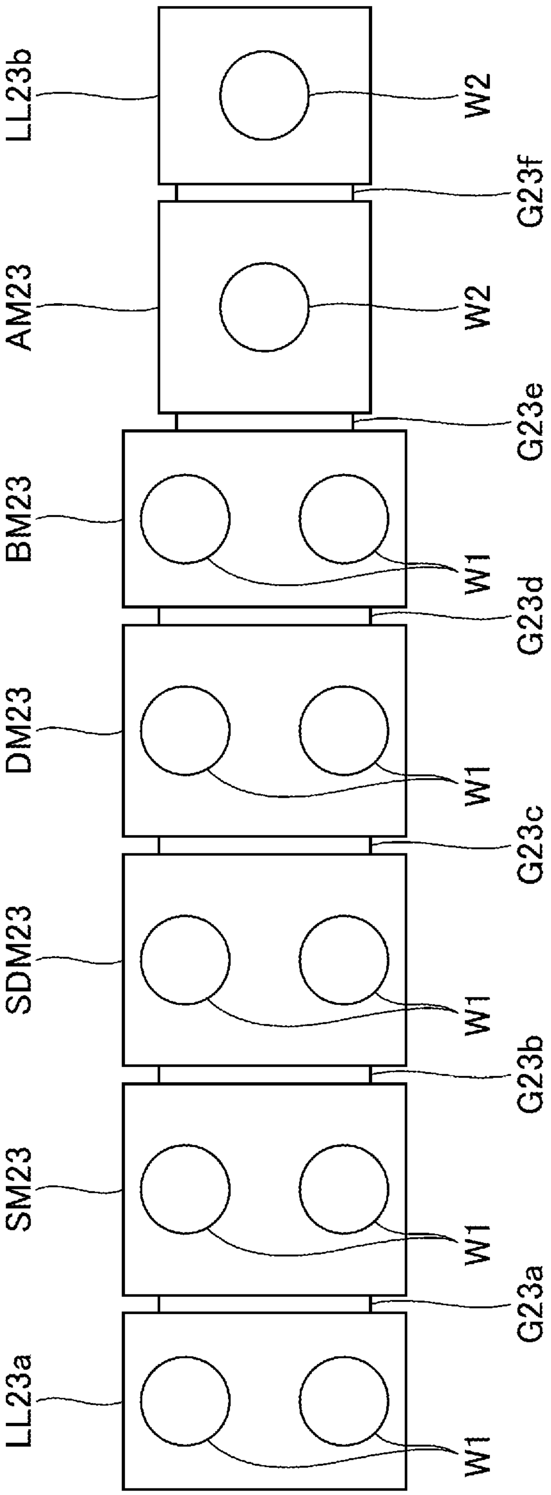
FIG. 9 is a diagram illustrating a third configuration example of the substrate bonding system according to the second embodiment.

As illustrated in FIG. 9, a substrate bonding system 2C includes load lock chambers LL23*a* and LL23*b*, a surface treatment module SM23, a SAM deposition module SDM23, a deposition module DM23, a bonding module BM23, and a heat treatment module AM23, and the like.

The load lock chamber LL23*a*, the surface treatment module SM23, the SAM deposition module SDM23, the deposition module DM23, the bonding module BM23, the heat treatment module AM23, and the load lock chamber LL23*b* are arranged in a line in this order.

The interior of the load lock chamber LL23*a* can be switched between an ambient atmosphere and a vacuum atmosphere. Substrates W1 are transferred to the load lock chamber LL23*a* from outside of the substrate bonding system 2C.

The surface treatment module SM23 is coupled to the load lock chamber LL23*a* via a gate valve G23*a*. The substrates W1 are vacuum-transferred from the load lock chamber LL23*a* to the surface treatment module SM23. The surface treatment module SM23 may have the same configuration as the surface treatment module SM21.

The SAM deposition module SDM23 is coupled to the surface treatment module SM23 via a gate valve G23*b*. The substrates W1 are vacuum-transferred from the surface treatment module SM23 to the SAM deposition module SDM23. The SAM deposition module SDM23 may have the same configuration as the SAM deposition module SDM21.

The deposition module DM23 is coupled to the SAM deposition module SDM23 via a gate valve G23*c*. The substrates W1 are vacuum-transferred from the SAM deposition module SDM23 to the deposition module DM23. The deposition module DM23 may have the same configuration as the deposition module DM21.

The bonding module BM23 is coupled to the deposition module DM23 via a gate valve G23*d*. The substrates W1 are vacuum-transferred from the deposition module DM23 to the bonding module BM23. The bonding module BM23 may have the same configuration as the bonding module BM21.

The heat treatment module AM23 is coupled to the bonding module BM23 via a gate valve G23*e*. A bonded body W2 is vacuum-transferred from the bonding module BM23 to the heat treatment module AM23. The heat treatment module AM23 may have the same configuration as the heat treatment module AM21.

The load lock chamber LL23*b* is coupled to the heat treatment module AM23 via a gate valve G23*f*. The bonded body W2 is vacuum-transferred from the heat treatment module AM23 to the load lock chamber LL23*b*. The interior of the load lock chamber LL23*b* can be switched between an ambient atmosphere and a vacuum atmosphere. In the load lock chamber LL23*b*, the bonded body W2 that is heat-treated at the heat treatment module AM23 is transferred to the outside of the substrate bonding system 2C.

A fourth configuration example of the substrate bonding system according to the second embodiment will be described with reference to FIG. 10. The substrate bonding system illustrated in FIG. 10 is an in-line system in which processing modules are arranged in series, and is a system in which two substrates are bonded after each of the processing modules performs a predetermined process on a substrate without exposing the substrate to the atmosphere.

Figure 10:
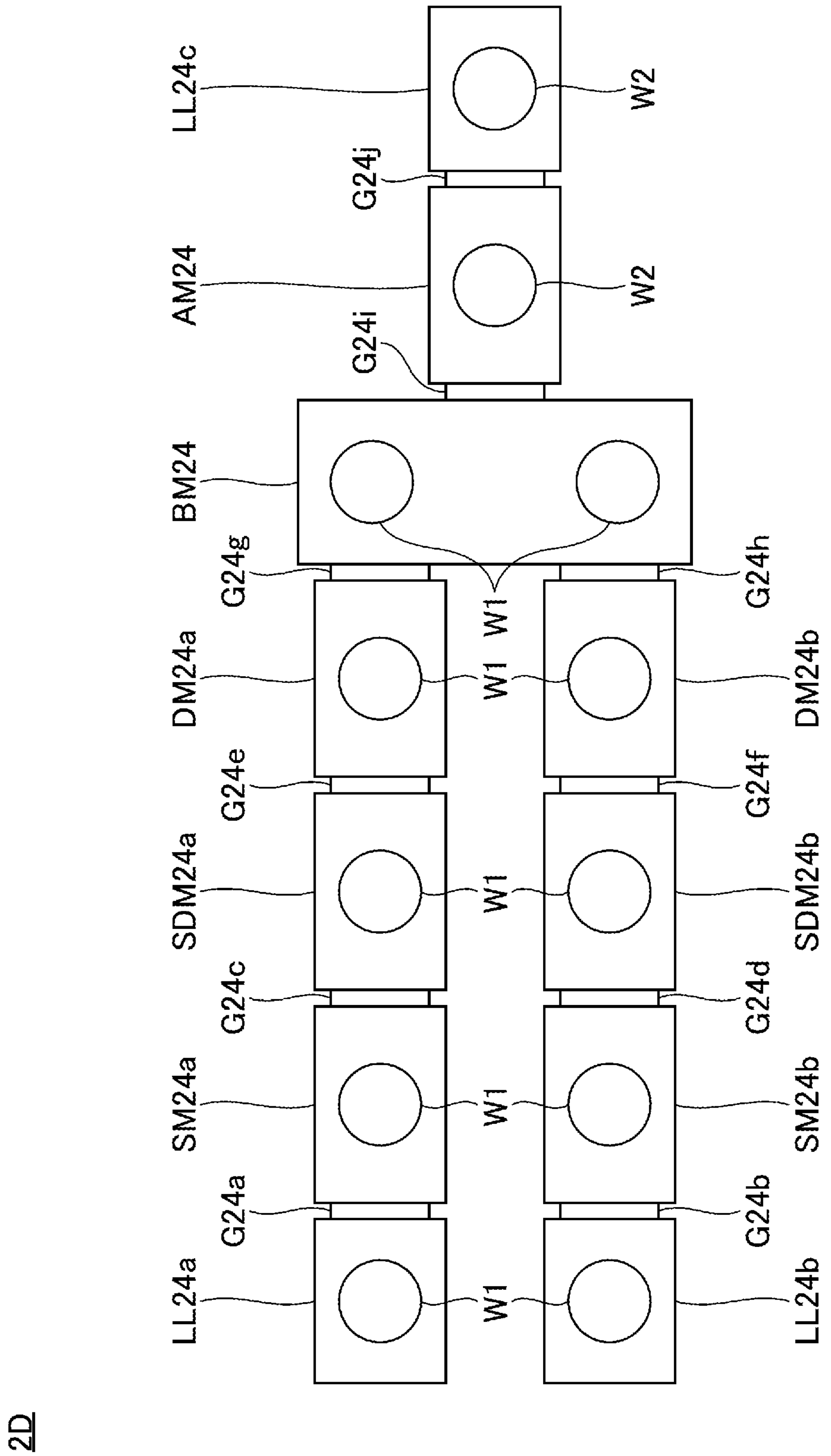
FIG. 10 is a diagram illustrating a fourth configuration example of the substrate bonding system according to the second embodiment.

As illustrated in FIG. 10, a substrate bonding system 2D includes load-lock chambers LL24*a* to LL24*c*, surface treatment modules SM24*a* and SM24*b*, SAM deposition modules SDM24*a* and SDM24*b*, deposition modules DM24*a* and DM24*b*, a bonding module BM24, and a heat treatment module AM24, and the like.

The load lock chamber LL24*a*, the surface treatment module SM24*a*, the SAM deposition module SDM24*a*, and the deposition module DM24*a* are arranged in a line in this order, and the deposition module DM24*a* is coupled to the bonding module BM24. The load lock chamber LL24*b*, the surface treatment module SM24*b*, the SAM deposition module SDM24*b*, and the deposition module DM24*b* are arranged in a line in this order, and the deposition module DM24*b* is coupled to the bonding module BM24. The load lock chamber LL24*a*, the surface treatment module SM24*a*, the SAM deposition module SDM24*a*, and the deposition module DM24*a* are arranged in parallel with the load lock chamber LL24*b*, the surface treatment module SM24*b*, the SAM deposition module SDM24*b*, and the deposition module DM24*b*.

The interior of each of the load lock chambers LL24*a* and LL24*b* can be switched between an ambient atmosphere and a vacuum atmosphere. A substrate W1 is transferred to each of the load lock chambers LL24*a* and LL24*b* from outside of the substrate bonding system 2D.

The surface treatment modules SM24*a* and SM24*b* are coupled to the load lock chambers LL24*a* and LL24*b* via gate valves G24*a* and G24*b*, respectively. Substrates W1 are vacuum-transferred from the load lock chambers LL24*a* and LL24*b* to the surface treatment modules SM24*a* and SM24*b*, respectively. The surface treatment modules SM24*a* and SM24*b* may have the same configuration as the surface treatment modules SM22*a* and SM22*b*.

The SAM deposition modules SDM24*a* and SDM24*b* are coupled to the surface treatment modules SM24*a* and SM24*b* via gate valves G24*c* and G24*d*, respectively. The substrates W1 are vacuum-transferred from the surface treatment modules SM24*a* and SM24*b* to the SAM deposition modules SDM24*a* and SDM24*b*, respectively. The SAM deposition modules SDM24*a* and SDM24*b* may have the same configuration as the SAM deposition modules SDM22*a* and SDM22*b*.

The deposition modules DM24*a* and DM24*b* are coupled to the SAM deposition modules SDM24*a* and SDM24*b* via gate valves G24*e* and G24*f*, respectively. The substrates W1 are vacuum-transferred from the SAM deposition modules SDM24*a* and SDM24*b* to the deposition modules DM24*a* and DM24*b*, respectively. The deposition modules DM24*a* and DM24*b* may have the same configuration as the deposition modules DM22*a* and DM22*b*.

The bonding module BM24 is coupled to the deposition modules DM24*a* and DM24*b* via respective gate valves G24*g* and G24*h*. The substrate W1 is vacuum-transferred from each of the deposition modules DM24*a* and DM24*b* to the bonding module BM24. The bonding module BM24 may have the same configuration as the bonding module BM22.

The heat treatment module AM24 is coupled to the bonding module BM24 via a gate valve G24*i*. A bonded body W2 is vacuum-transferred from the bonding module BM24 to the heat treatment module AM24. The heat treatment module AM24 may have the same configuration as the heat treatment module AM22.

The load lock chamber LL24*c* is coupled to the heat treatment module AM24 via a gate valve G24*j*. The bonded body W2 is vacuum-transferred from the heat treatment module AM24 to the load lock chamber LL24*c*. The load lock chamber LL24*c* may have the same configuration as the load lock chamber LL22*e*.

(Method for Substrate Bonding)

As an example of the method for substrate bonding according to the second embodiment, a case where substrates are bonded by the substrate bonding system 2A illustrated in FIG. 7 will be described with reference to FIG. 11A and FIG. 11B, FIGS. 12A to 12D, and FIGS. 13A to 13C. In each of the substrate bonding systems 2B to 2D illustrated in FIGS. 8 to 10, substrates can be bonded as in the substrate bonding system 2A.

Figure 11A:
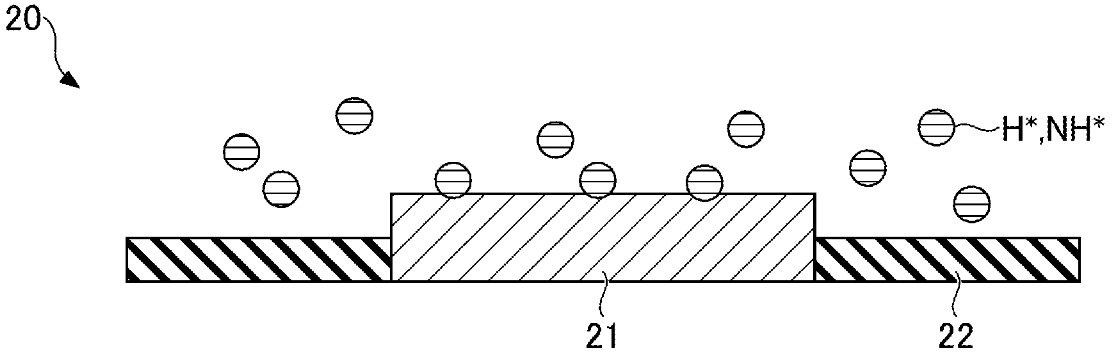
FIG. 11A is a cross-section view (1) illustrating an example of the method for substrate bonding according to the second embodiment.

Each substrate 20 is first prepared. In the present embodiment, as illustrated in FIG. 11A, the upper surface of the substrate 20 has a conductive layer 21 and an insulating layer 22. A step at which the upper surface of the conductive layer 21 is protruded from the upper surface of the insulating layer 22 is formed between the upper surface of the conductive layer 21 and the upper surface of the insulating layer 22. The conductive layer 21 is formed, for example, of Cu. The conductive layer 21 may include, for example, a line or an electrode pad. The insulating layer 22 is formed, for example, of a low-k material. The insulating layer 22 may include, for example, an interlayer dielectric film. A corrosion-inhibiting film (not illustrated) is formed on the substrate 20 as a protective film, so as to cover, for example, at least the upper surface of the conductive layer 21. The corrosion-inhibiting film is formed by CMP that uses a polishing slurry containing a corrosion inhibitor such as BTA (benzotriazole). The protective film need not be formed on the substrate 20.

Subsequently, the interior of each of the load lock chambers LL21*a* and LL21*b* is switched to the ambient atmosphere. Then, the prepared substrates 20 are transferred, for example, to the respective load lock chambers LL21*a* and LL21*b*. Subsequently, the interior of each of the load lock chambers LL21*a* and LL21*b* in which the substrate 20 is accommodated is switched from the ambient atmosphere to the vacuum atmosphere. Subsequently, the gate valves G21*f*, G21*g*, and G21*a* are opened, the substrate 20 in each of the load-lock chambers LL21*a* and LL21*b* is transferred to the surface treatment module SM21 through the vacuum transfer robot in the vacuum transfer chamber TM21, and then the gate valves G21*f*, G21*g*, and G21*a* are closed.

Subsequently, plasma processing is performed on the surface of each substrate 20. With this approach, the upper surface of the conductive layer 21 and the upper surface of the insulating layer 22 are cleaned. In the present embodiment, as illustrated in FIG. 11A, within the surface treatment module SM21, the upper surface of the conductive layer 21 and the upper surface of the insulating layer 22 are exposed by supplying radicals, such as H radicals (H*) or NH radicals (NH*), onto the substrate 20, and by removing a contaminant, a natural oxide film, or a corrosion-inhibiting film, or the like that is generated on the surface of the substrate 20.

Subsequently, the gate valves G21*a* and G21*b* are opened, substrates 20 that are processed within the surface treatment module SM21 are transferred to the SAM deposition module SDM21 through the vacuum transfer robot in the vacuum transfer chamber TM21, and then the gate valves G21*a* and G21*b* are closed.

Figure 11B:
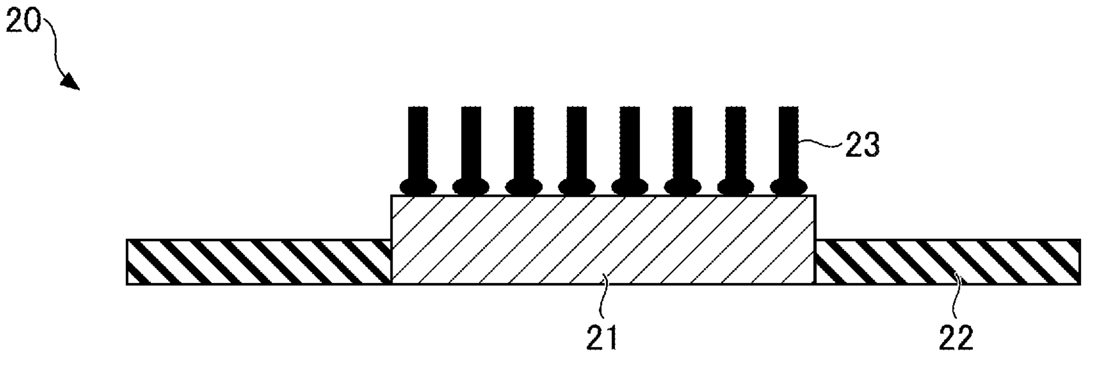
FIG. 11B is a cross-section view (1) illustrating an example of the method for substrate bonding according to the second embodiment.

Subsequently, a deposition process is performed on each substrate 20 on which the plasma processing is performed in the surface treatment module SM21 to selectively deposit a SAM 23 on the cleaned surface of the conductive layer 21. In the present embodiment, as illustrated in FIG. 11B, the SAM 23 is selectively deposited on the exposed surface of the conductive layer 21 by supplying the process gas onto each substrate 20 within the SAM deposition module SDM 21.

Subsequently, the gate valves G21*b* and G21*c* are opened, the substrates 20 that are processed in the SAM deposition module SDM 21 are transferred to the deposition module DM21 by the vacuum transfer robot in the vacuum transfer chamber TM11, and then the gate valves G21*b* and G21*c* are closed.

Figure 12A:
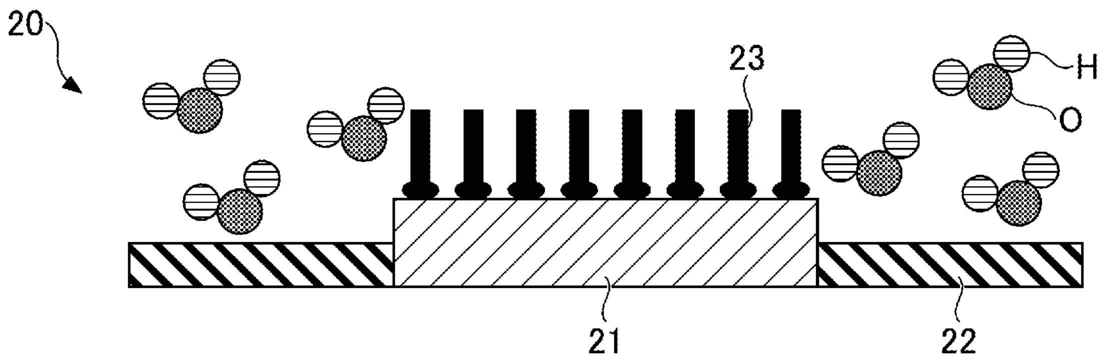
FIG. 12A is a cross-section view (2) illustrating an example of the method for substrate bonding according to the second embodiment.
Figure 12B:
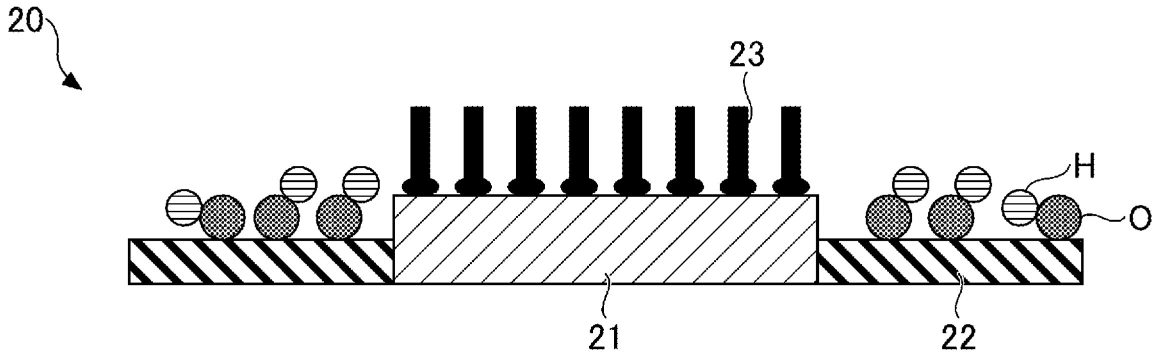
FIG. 12B is a cross-section view (2) illustrating an example of the method for substrate bonding according to the second embodiment.
Figure 12C:
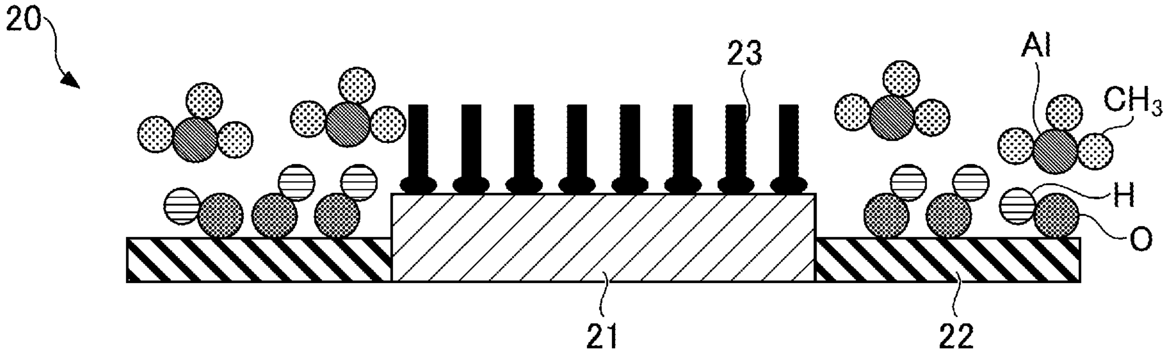
FIG. 12C is a cross-section view (2) illustrating an example of the method for substrate bonding according to the second embodiment.
Figure 12D:
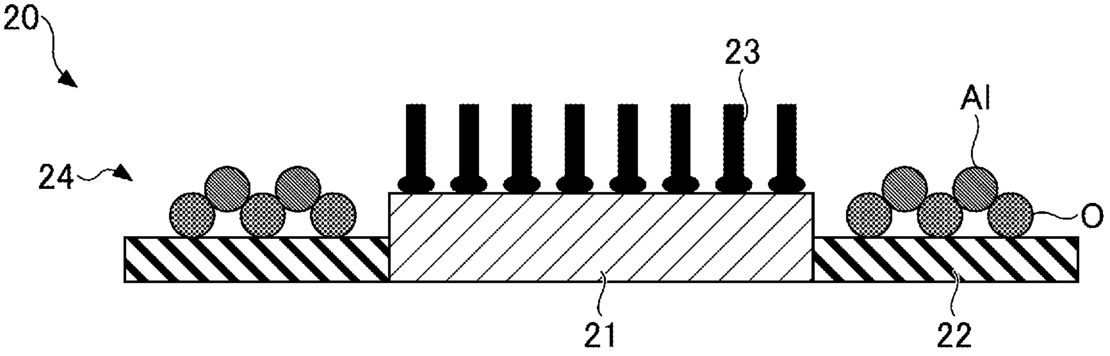
FIG. 12D is a cross-section view (2) illustrating an example of the method for substrate bonding according to the second embodiment.

Subsequently, an insulating film 24 is selectively deposited on the cleaned surface of the insulating layer 22 by performing a deposition process on each substrate 20 on which the SAM23 is formed in the SAM deposition module SDM21. In the present embodiment, as illustrated in FIG. 12A, the process gas such as $H_2O$ or $O_2$ is supplied onto each substrate 20 within the deposition module DM21. Also, the interior of the deposition module DM21 is evacuated. With this approach, the upper surface of the insulating layer 22 becomes in a state in which hydroxyl (OH) groups are adsorbed on the upper surface of the insulating layer 22, as illustrated in FIG. 12B. Further, as illustrated in FIG. 12C, the process gas such as $Al(CH_3)_3$ is supplied onto the substrate 20. The process gas may be also activated using a plasma formation apparatus. As illustrated in FIG. 12D, a purge gas such as $H_2$, Ar, or $N_2$ is supplied onto the substrate 20. The purge gas may be activated using a plasma formation apparatus. In such a manner, by repeating the supply of the process gas, and the supply of the purge gas, onto the substrate 20, the insulating film 24 is selectively deposited on the exposed surface of the insulating layer 22, and the SAM 23 is desorbed from the exposed surface of the conductive layer 21. The insulating film 24 includes, for example, an $Al_2O_3$ film. At this time, the surface shape of the outermost surface of each substrate 20 can be controlled by changing the number of repetitions for the supply of the process gas and the supply of the purge gas. For example, by increasing the number of repetitions, a film thickness of the insulating film 24 that is formed on the exposed surface of the insulating layer 22 is increased, and the step on the outermost surface of the substrate 20 is reduced. The number of repetitions is set, for example, in accordance with a thermal expansion coefficient of a material that constitutes the conductive layer 21, a thermal expansion coefficient of a material that constitutes the insulating layer 22, and a temperature for the heat treatment described below.

Subsequently, the gate valves G21*c* and G21*d* are opened, substrates 20 that are processed within the deposition module DM21 are transferred to the bonding module BM21 through the vacuum transfer robot in the vacuum transfer chamber TM21, and then the gate valves G21*c* and G21*d* are closed.

Figure 13A:
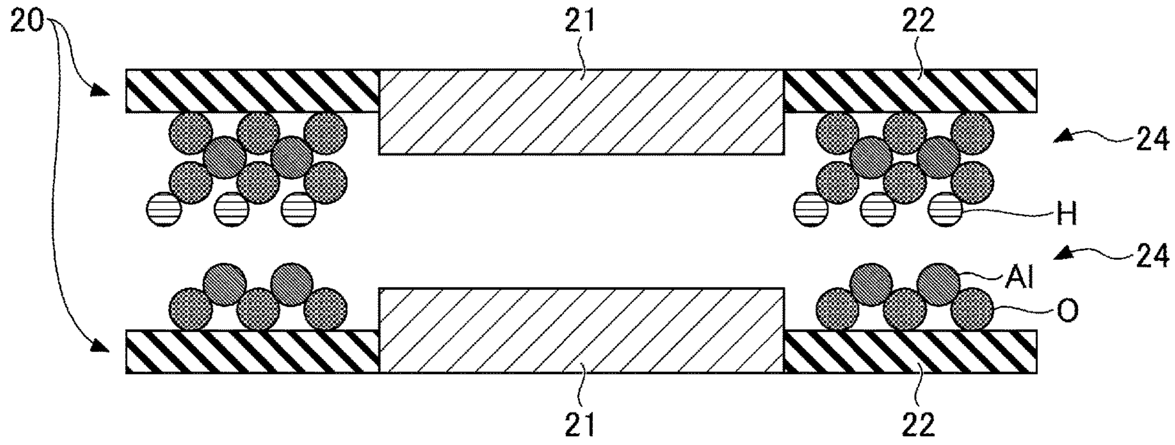
FIG. 13A is a cross-section view (3) illustrating an example of the method for substrate bonding according to the second embodiment.
Figure 13B:
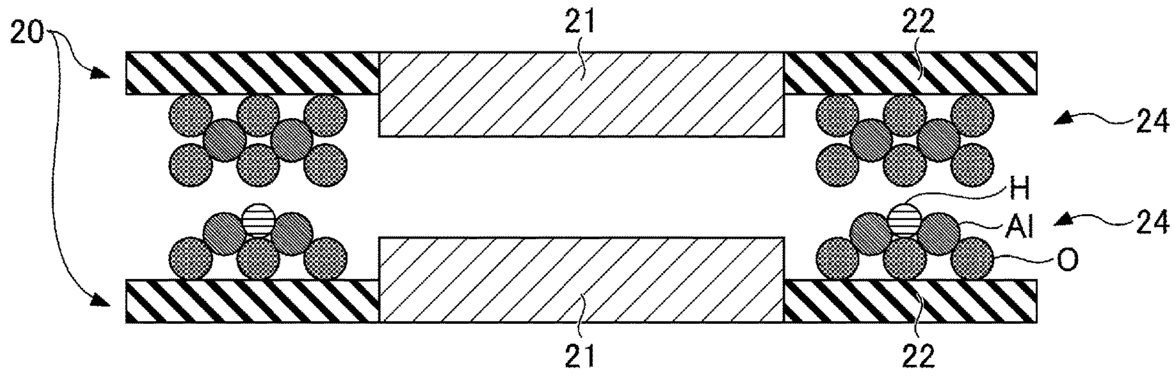
FIG. 13B is a cross-section view (3) illustrating an example of the method for substrate bonding according to the second embodiment.

Subsequently, the substrates 20 on which the deposition process is performed in the deposition module DM21 are bonded to form a bonded body 20X. In the present embodiment, as illustrated in FIG. 13A, in the bonding module BM21, the conductive layer 21 and the insulating layer 22 (insulating film 24) of one substrate 20 are respectively positioned with respect to the conductive layer 21 and the insulating layer 22 (insulating film 24) of the other substrate 20. After the positioning, two substrates 20 are bonded to form the bonded body 20X as illustrated in FIG. 13B.

Subsequently, the gate valves G21*d* and G21*e* are opened, the bonded body 20X that is obtained within the bonding module BM21 is transferred to the heat treatment module AM21 through the vacuum transfer robot in the vacuum transfer chamber TM21, and then the gate valves G21*d* and G21*e* are closed.

Figure 13C:
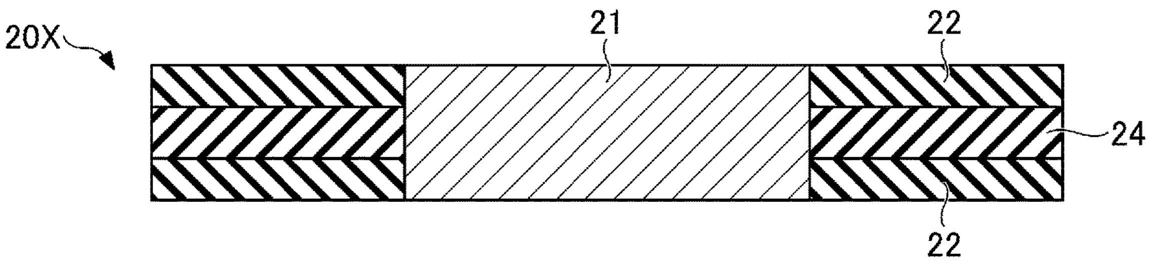
FIG. 13C is a cross-section view (3) illustrating an example of the method for substrate bonding according to the second embodiment.

Subsequently, the bonded body 20X that is formed in the bonding module BM21 is heat-treated. In the present embodiment, as illustrated in FIG. 13C, bonding strength of the two substrates 20 that constitute the bonded body 20X is increased by heat-treating the bonded body 20X within the heat treatment module AM21.

Subsequently, the gate valves G21*e* and G21*g* are opened, the bonded body 20X that is heat-treated within the heat treatment module AM21 is transferred to, for example, the load-lock chamber LL21*b* through the vacuum transfer robot in the vacuum transfer chamber TM21, and then the gate valves G21*e* and G21*g* are closed. The load lock chamber LL21*a* may be used instead of the load lock chamber LL21*b*.

Subsequently, the interior of the load lock chamber LL21*b* is switched from the vacuum atmosphere to the ambient atmosphere, and the bonded body 20X is transferred from the interior of the load lock chamber LL21*a* to the outside of the substrate bonding system 2A.

According to the second embodiment described above, the upper surface of the conductive layer 21 and the upper surface of the insulating layer 22 are cleaned by performing plasma processing on the surface of each substrate 20. Then, the insulating film 24 is selectively deposited on the cleaned surface of the insulating layer 22 to control the surface shape. Then, two substrates 20 are bonded to form the bonded body 20X by performing hybrid bonding in which conductive layers 21 are bonded together with insulating layers 22 (insulating films 24) in a state where given surface shapes are controlled. Thus, the contact area between the conductive layers 21 can be increased. As a result, contact resistance is reduced, and bonding strength is improved. That is, the conductive layers 21 can be bonded with high reliability.

Also, according to the second embodiment, the plasma processing in the surface treatment module, the deposition process in the SAM deposition module, the deposition process in the deposition module, and the bonding process in the bonding module are continuously performed in this order without exposing substrates 20 to the atmosphere. With this approach, contamination of each substrate 20 and oxidation, and the like of the surface of the conductive layer 21, during transfer between modules can be reduced. As a result, generation of fine defects (voids) caused by a contaminant or an oxide film at the interface surface of the bonded body 20X is reduced, and thus bonding strength is improved.

Also, according to the second embodiment, the bonded body 20X is transferred from the bonding module to the heat treatment module without being exposed to the atmosphere, and then is heat-treated after the bonding process. With this approach, productivity is improved and bonding strength is improved, in comparison to a case where the bonded body 20X is heat-treated outside the substrate bonding system.

Third Embodiment (Substrate Bonding System)

A first configuration example of the substrate bonding system according to the third embodiment will be described with reference to FIG. 14. The substrate bonding system illustrated in FIG. 14 is a cluster system in which processing modules are arranged in a star shape around a vacuum transfer chamber, and is a system in which each substrate is vacuum-transferred between various processing modules by using the vacuum transfer chamber, and then two substrates are bonded after performing predetermined processes on the substrate.

Figure 14:
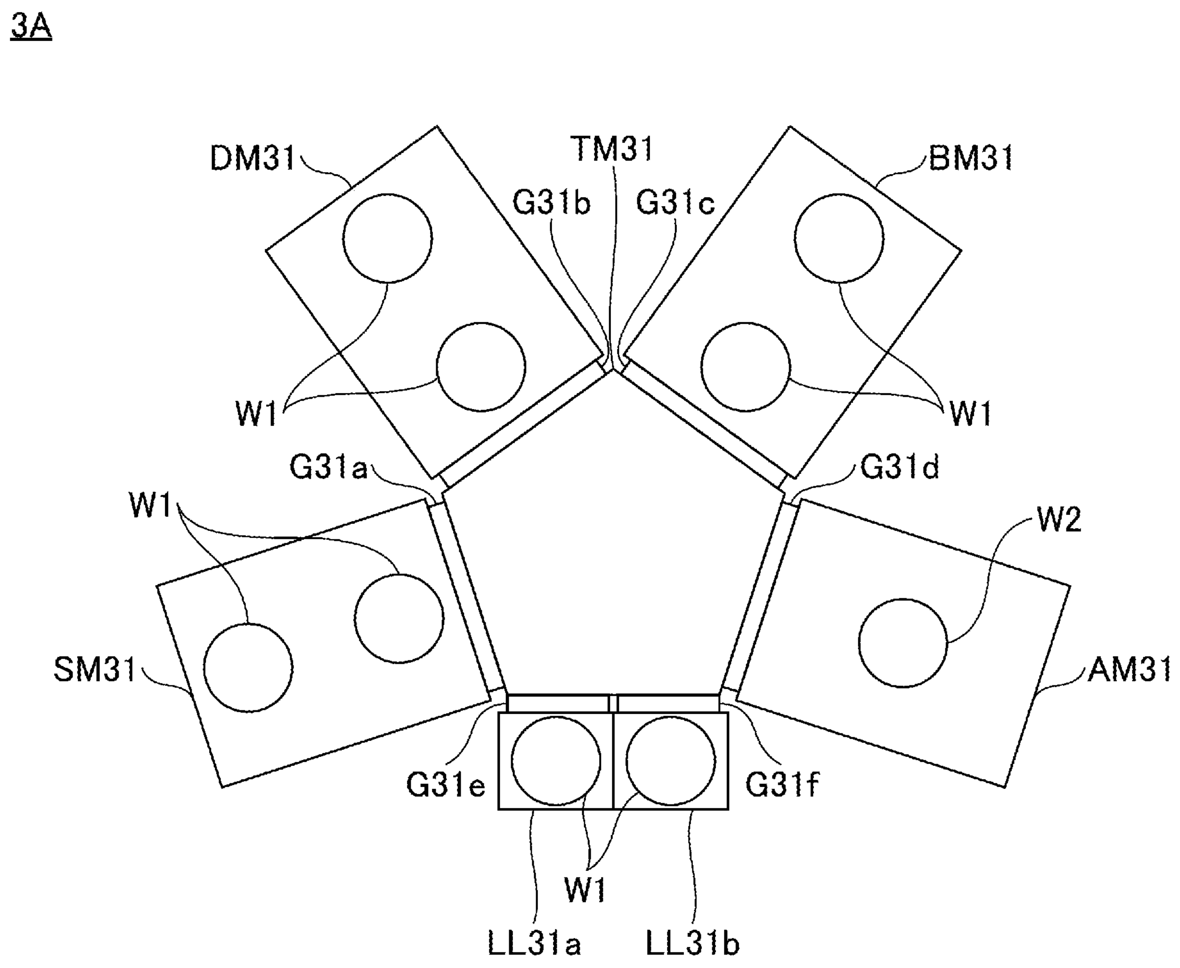
FIG. 14 is a diagram illustrating a first configuration example of the substrate bonding system according to a third embodiment.

As illustrated in FIG. 14, a substrate bonding system 3A includes a surface treatment module SM31, a deposition module DM31, a bonding module BM31, a heat treatment module AM31, a vacuum transfer chamber TM31, and load lock chambers LL31*a* and LL31*b*, and the like.

The surface treatment module SM31, the deposition module DM31, the bonding module BM31, and the heat treatment module AM31 are coupled to the vacuum transfer chamber TM31 via gate valves G31*a* to G31*d*, respectively. The load lock chambers LL31*a* and LL31*b* are coupled to the vacuum transfer chamber TM31 via gate valves G31*e* and G31*f*, respectively.

The surface treatment module SM31, the bonding module BM31, the heat treatment module AM31, the vacuum transfer chamber TM31, and the load lock chambers LL31*a* and LL31*b* may have the same configurations as the surface treatment module SM11, the bonding module BM11, the heat treatment module AM11, the vacuum transfer chamber TM11, and the load lock chambers LL11*a* and LL11*b* of the substrate bonding system 1A illustrated in FIG. 1, respectively.

The interior of the deposition module DM31 is depressurized to a predetermined vacuum atmosphere. The deposition module DM31 accommodates, for example, two substrates W1 therein, and performs the deposition process on the two substrates W1 to selectively deposit a metal film in a predetermined region of each substrate W1. As described above, the deposition module DM11 is a processing module that selectively deposits the metal film in the predetermined region, and is also referred to as a selective deposition module. An example of the metal film includes platinum (Pt). The metal film is formed, for example, by ALD or CVD. Examples of the gas used in the ALD or the CVD include a process gas, such as $(CH_3C_5H_4)Pt(CH_3)_3$, $O_2$, or $N_2$, and a purge gas such as $N_2$. The process gas and the purge gas may be also activated using a plasma formation apparatus. Examples of the plasma formation apparatus include a microwave plasma apparatus, an ICP apparatus, a CCP apparatus, and a SWP apparatus.

A second configuration example of the substrate bonding system according to the third embodiment will be described with reference to FIG. 15. The substrate bonding system illustrated in FIG. 15 is a cluster system in which processing modules are arranged in a star shape around a vacuum transfer chamber, and is a system in which a substrate is vacuum-transferred between various processing modules by using the vacuum transfer chamber, and then two substrates are bonded after performing predetermined processes on the substrate.

Figure 15:
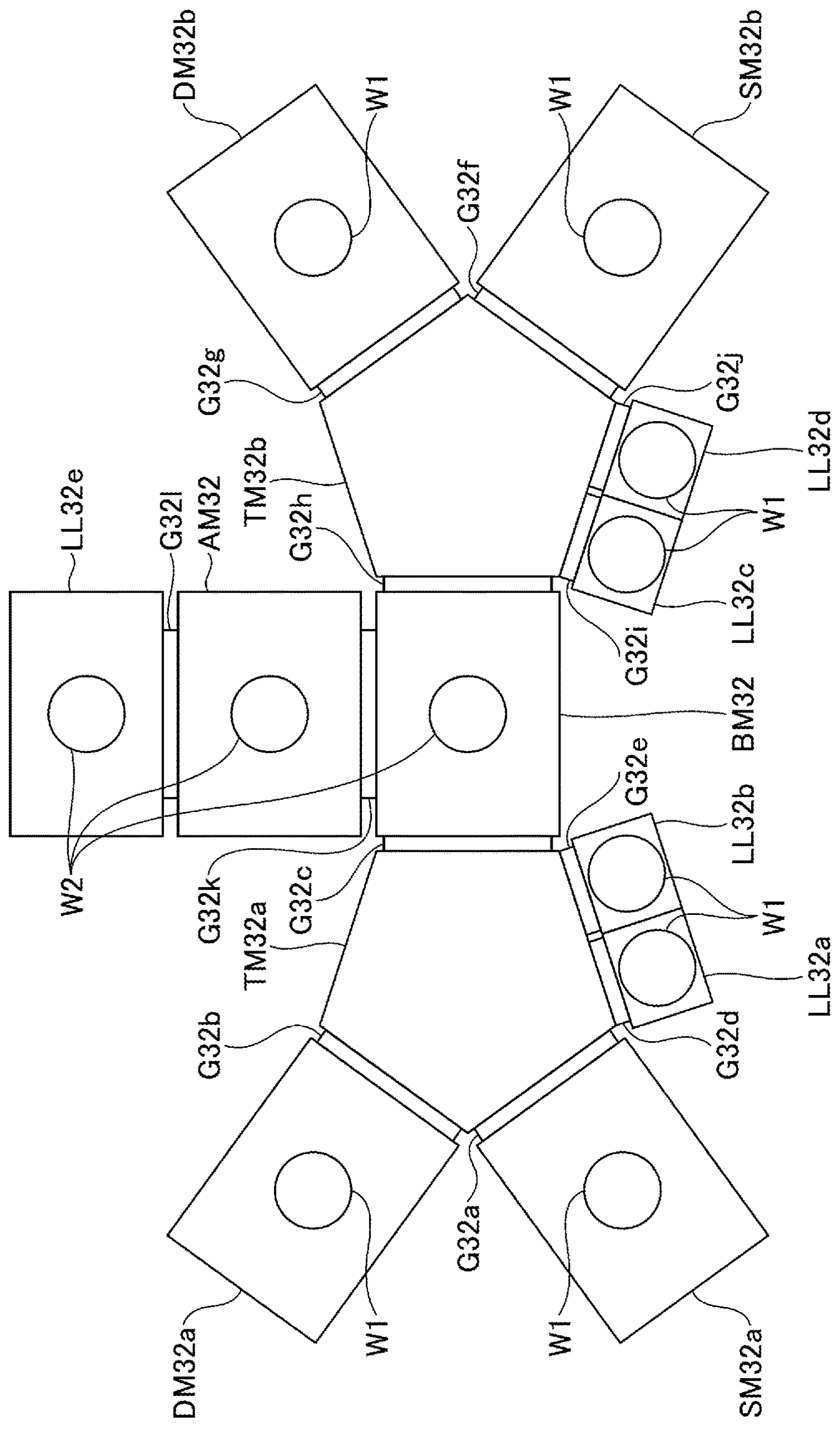
FIG. 15 is a diagram illustrating a second configuration example of the substrate bonding system according to the third embodiment.

As illustrated in FIG. 15, a substrate bonding system 3B includes surface treatment modules SM32*a* and SM32*b*, deposition modules DM32*a* and DM32*b*, a bonding module BM32, a heat treatment module AM32, vacuum transfer chambers TM32*a* and TM32*b*, and load lock chambers LL32*a* to LL32*e*, and the like.

The surface treatment module SM32*a*, the deposition module DM32*a*, the bonding module BM32, and the load lock chambers LL32*a* and LL32*b* are coupled to the vacuum transfer chamber TM32*a* via gate valves G32*a* to G32*e*, respectively. The surface treatment module SM32*b*, the deposition module DM32*b*, the bonding module BM32, and the load lock chambers LL32*c* and LL32*d* are coupled to the vacuum transfer chamber TM32*b* via gate valves G32*f* to G22*j*, respectively. The heat treatment module AM32 is coupled to the bonding module BM32 via a gate valve G32*k*, and is coupled to the load lock chamber LL32*e* via a gate valve G321.

The surface treatment modules SM32*a* and SM32*b*, DM32*b*, the bonding module BM32, the heat treatment module AM32, the vacuum transfer chambers TM32*a* and TM32*b*, and the load lock chambers LL32*a* to LL32*e* may have the same configurations as the surface treatment modules SM12*a* and SM12*b*, the bonding module BM12, the heat treatment module AM12, the vacuum transfer chambers TM12*a* and TM12*b*, and the load lock chambers LL12*a* to LL12*e* of the substrate bonding system 1B illustrated in FIG. 1, respectively.

The deposition modules DM32*a* and DM32*b* may have the same configuration as the deposition module DM31.

A third configuration example of the substrate bonding system according to the third embodiment will be described with reference to FIG. 16. The substrate bonding system illustrated in FIG. 16 is an in-line system in which processing modules are arranged in series, and is a system in which two substrates are bonded after each of the processing modules performs a predetermined process on the substrates without exposing the substrates to the atmosphere.

Figure 16:
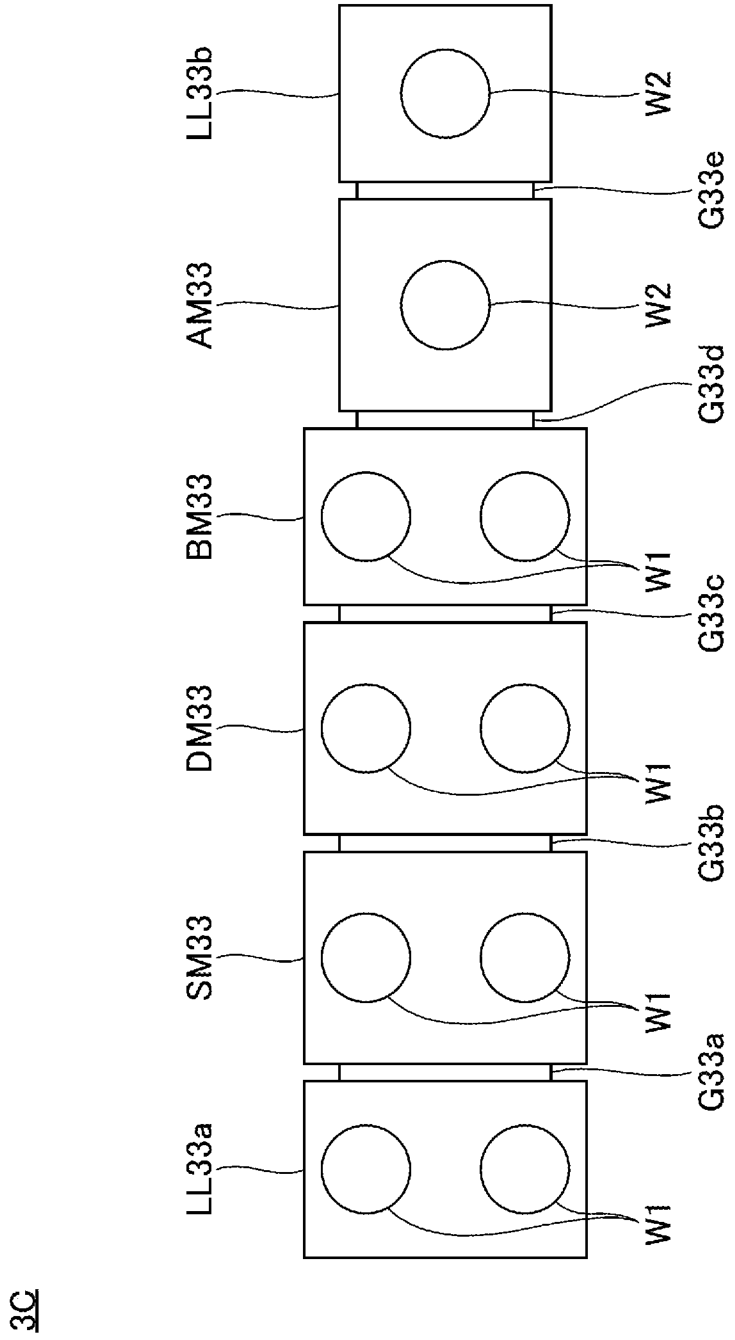
FIG. 16 is a diagram illustrating a third configuration example of the substrate bonding system according to the third embodiment.

As illustrated in FIG. 16, a substrate bonding system 3C includes load lock chambers LL33*a* and LL33*b*, a surface treatment module SM33, a deposition module DM33, a bonding module BM33, and a heat treatment module AM33, and the like.

The load lock chamber LL33*a*, the surface treatment module SM33, the deposition module DM33, the bonding module BM33, the heat treatment module AM33, and the load lock chamber LL33*b* are arranged in a line in this order.

The interior of the load lock chamber LL33*a* can be switched between an ambient atmosphere and a vacuum atmosphere. Substrates W1 are transferred to the load lock chamber LL33*a* from outside of the substrate bonding system 3C.

The surface treatment module SM33 is coupled to the load lock chamber LL33*a* via a gate valve G33*a*. The substrates W1 are vacuum-transferred from the load lock chamber LL33*a* to the surface treatment module SM33. The surface treatment module SM33 may have the same configuration as the surface treatment module SM31.

The deposition module DM33 is coupled to the surface treatment module SM33 via a gate valve G33*b*. The substrates W1 are vacuum-transferred from the surface treatment module SM33 to the deposition module DM33. The deposition module DM33 may have the same configuration as the deposition module DM31.

The bonding module BM33 is coupled to the deposition module DM33 via a gate valve G33*c*. The substrates W1 are vacuum-transferred from the deposition module DM33 to the bonding module BM33. The bonding module BM33 may have the same configuration as the bonding module BM31.

The heat treatment module AM33 is coupled to the bonding module BM33 via a gate valve G23*d*. A bonded body W2 is vacuum-transferred to the heat treatment module AM33 from the bonding module BM33. The heat treatment module AM33 may have the same configuration as the heat treatment module AM31.

The load lock chamber LL33*b* is coupled to the heat treatment module AM33 via a gate valve G33*e*. The bonded body W2 is vacuum-transferred from the heat treatment module AM33 to the load lock chamber LL33*b*. The interior of the load lock chamber LL33*b* can be switched between the ambient atmosphere and the vacuum atmosphere. In the load lock chamber LL33*b*, the bonded body W2 that is heat-treated in the heat treatment module AM33 is transferred to the outside of the substrate bonding system 3C.

A fourth configuration example of the substrate bonding system according to the third embodiment will be described with reference to FIG. 17. The substrate bonding system illustrated in FIG. 17 is an in-line system in which processing modules are arranged in series, and is a system in which two substrates are bonded after each of the processing modules performs a predetermined process on a substrate without exposing the substrate to the atmosphere.

Figure 17:
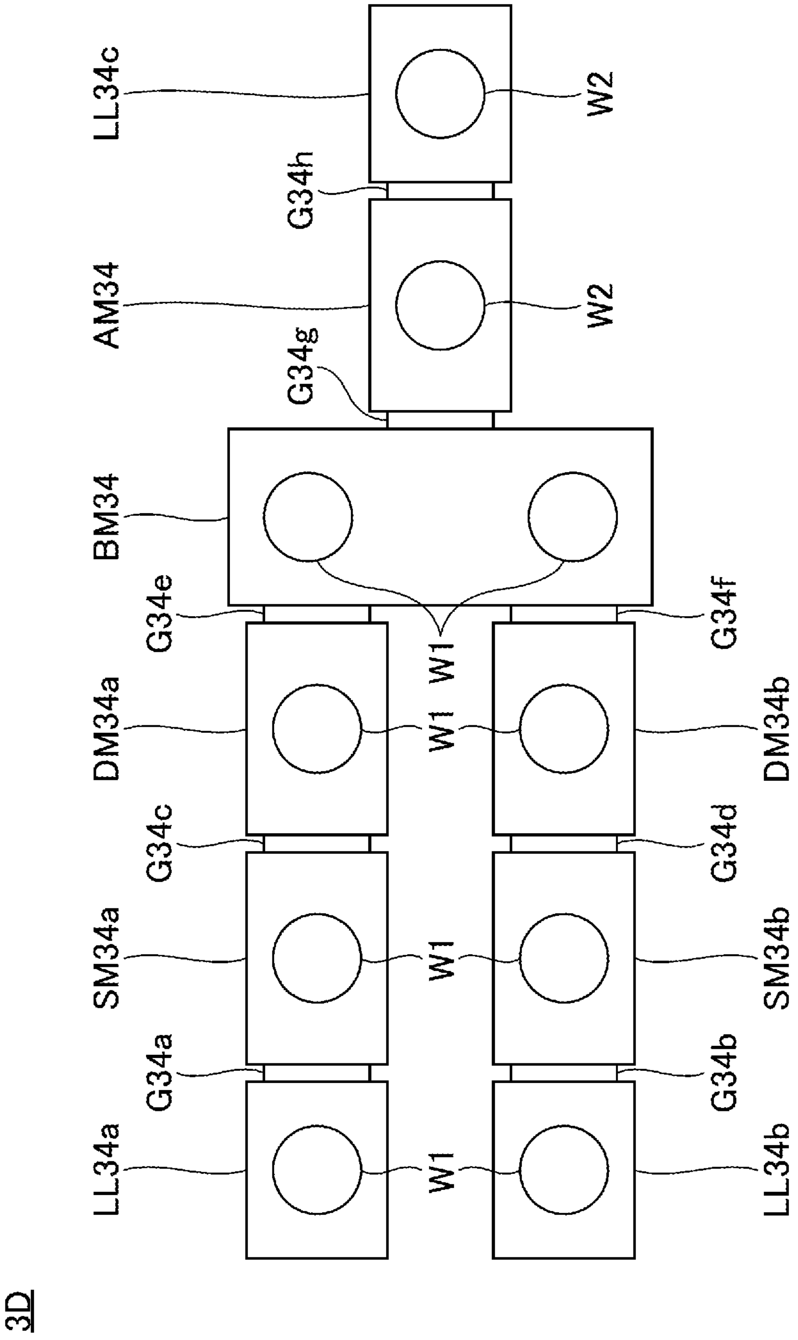
FIG. 17 is a diagram illustrating a fourth configuration example of the substrate bonding system according to the third embodiment.

As illustrated in FIG. 17, a substrate bonding system 3D includes load lock chambers LL34*a* to LL34*c*, surface treatment modules SM34*a* and SM34*b*, deposition modules DM34*a* and 34*b*, a bonding module BM34, and a heat treatment module AM34, and the like.

The load lock chamber LL34*a*, the surface treatment module SM34*a*, and the deposition module DM34*a* are arranged in a line in this order, and the deposition module DM34*a* is coupled to the bonding module BM34. The load lock chamber LL34*b*, the surface treatment module SM34*b*, and the deposition module DM34*b* are arranged in a line in this order, and the deposition module DM34*b* is coupled to the bonding module BM34. The load lock chamber LL34*a*, the surface treatment module SM34*a*, and the deposition module DM34*a* are arranged in parallel with the load lock chamber LL34*b*, the surface treatment module SM34*b*, and the deposition module DM34*b*.

The interior of each of the load lock chambers LL34*a* and LL34*b* can be switched between an ambient atmosphere and a vacuum atmosphere. A substrate W1 is transferred to each of the load lock chambers LL34*a* and LL34*b* from outside of the substrate bonding system 3D.

The surface treatment modules SM34*a* and SM34*b* are coupled to the load lock chambers LL34*a* and LL34*b* via gate valves G34*a* and G34*b*, respectively. Substrates W1 are vacuum-transferred from the load lock chambers LL34*a* and LL34*b* to the surface treatment modules SM34*a* and SM34*b*, respectively. The surface treatment modules SM34*a* and SM34*b* may have the same configuration as the surface treatment modules SM32*a* and SM32*b*.

The deposition modules DM34*a* and DM34*b* are coupled to the surface treatment modules SM34*a* and SM34*b* via gate valves G34*c* and G34*d*, respectively. The substrates W1 are vacuum-transferred to the deposition modules DM34*a* and DM34*b* from the surface treatment modules SM34*a* and SM34*b*, respectively. The deposition modules DM34*a* and DM34*b* may have the same configuration as the deposition modules DM32*a* and DM32*b*.

The bonding module BM34 is coupled to the deposition modules DM34*a* and DM34*b* via respective gate valves G34*e* and G34*f*. The substrate W1 is vacuum-transferred from each of the deposition modules DM34*a* and DM34*b* to the bonding module BM34. The bonding module BM34 may have the same configuration as the bonding module BM32.

The heat treatment module AM34 is coupled to the bonding module BM34 via a gate valve G34*g*. A bonded body W2 is vacuum-transferred from the bonding module BM34 to the heat treatment module AM34. The heat treatment module AM34 may have the same configuration as the heat treatment module AM32.

The load lock chamber LL34*c* is coupled to the heat treatment module AM34 via a gate valve G34*h*. The bonded body W2 is vacuum-transferred from the heat treatment module AM34 to the load lock chamber LL34*c*. The load lock chamber LL34*c* may have the same configuration as the load lock chamber LL32*e*.

(Method for Substrate Bonding)

As an example of the method for substrate bonding according to the third embodiment, a case where substrates are bonded by the substrate bonding system 3A illustrated in FIG. 14 will be described with reference to FIG. 18, FIGS. 19A to 19E, and FIGS. 20A to 20C. In each of the substrate bonding systems 3B to 3D illustrated in FIG. 15 to FIG. 17, substrates can be bonded as in the substrate bonding system 3A.

Figure 18:
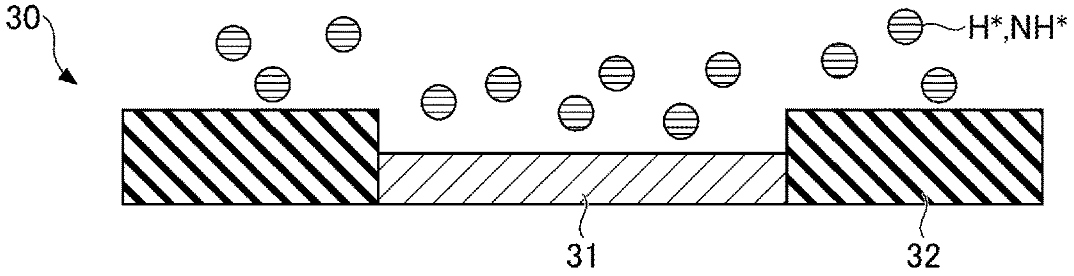
FIG. 18 is a cross-section view (1) illustrating an example of the method for substrate bonding according to the third embodiment.

Each substrate 30 is first prepared. In the present embodiment, as illustrated in FIG. 18, the upper surface of the substrate 30 has a conductive layer 31 and an insulating layer 32. A step at which the upper surface of the conductive layer 31 is recessed with respect to the upper surface of the insulating layer 32 is formed between the upper surface of the conductive layer 31 and the upper surface of the insulating layer 32. The conductive layer 31 is formed, for example, of Cu. The conductive layer 31 may include, for example, a line or an electrode pad. The insulating layer 32 is formed, for example, of a low-k material. The insulating layer 32 may include, for example, an interlayer dielectric film. For example, a corrosion-inhibiting film (not illustrated) is formed as a protective film on the substrate 30, so as to cover at least the upper surface of the conductive layer 31. The corrosion-inhibiting film is formed by CMP that uses a polishing slurry containing a corrosion inhibitor such as BTA. The protective film need not be formed on the substrate 30.

Subsequently, the interior of each of the load lock chambers LL31*a* and LL31*b* is switched to the ambient atmosphere. Then, the prepared substrate 30 is transferred, for example, to each of the load lock chambers LL31*a* and LL31*b*. Subsequently, the interior of each of the load lock chambers LL31*a* and LL31*b* in which the substrate 30 is accommodated is switched from the ambient atmosphere to the vacuum atmosphere. Subsequently, the gate valves G31*e*, G31*f*, and G31*a* are opened, the substrate 30 in each of the load lock chambers LL31*a* and LL31*b* is transferred to the surface treatment module SM31 by the vacuum transfer robot in the vacuum transfer chamber TM31, and then the gate valves G31*e*, G31*f*, and G31*a* are closed.

Subsequently, plasma processing is performed on the surface of each substrate 30. With this approach, the upper surface of the conductive layer 31 and the upper surface of the insulating layer 32 are cleaned. In the present embodiment, as illustrated in FIG. 18, the upper surface of the conductive layer 31 and the upper surface of the insulating layer 32 are exposed by supplying radicals, such as H radicals (H*) or NH radicals (NH*), onto the substrate 30 within the surface treatment module SM31, and by removing a contaminant, a natural oxide film, or a corrosion-inhibiting film, or the like that is generated on the surface of the substrate 30.

Subsequently, the gate valves G31*a* and G31*b* are opened, substrates 30 that are processed within the surface treatment module SM31 are transferred to the deposition module DM31 through the vacuum transfer robot in the vacuum transfer chamber TM31, and then the gate valves G31*a* and G31*b* are closed.

Figure 19A:
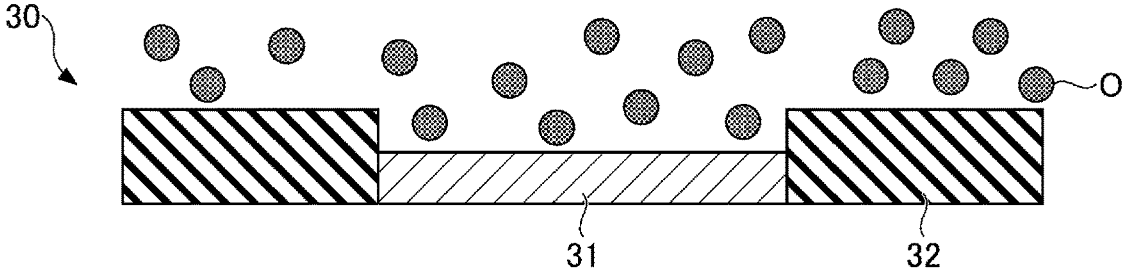
FIG. 19A is a cross-section view (2) illustrating an example of the method for substrate bonding according to the third embodiment.
Figure 19B:
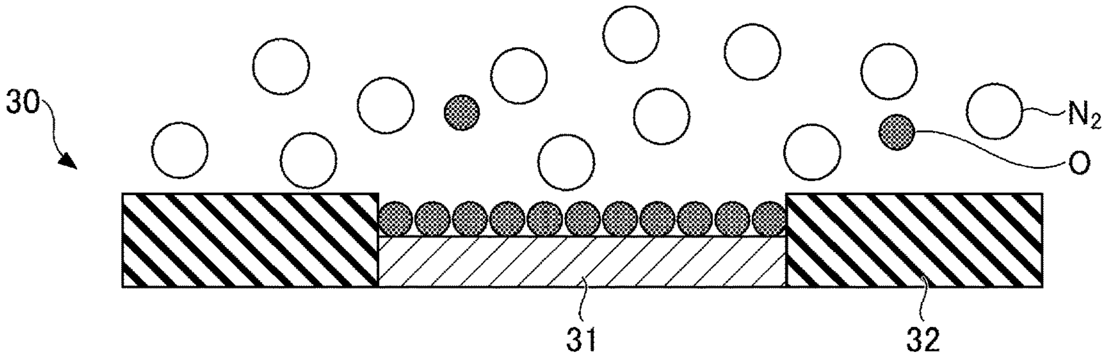
FIG. 19B is a cross-section view (2) illustrating an example of the method for substrate bonding according to the third embodiment.
Figure 19C:
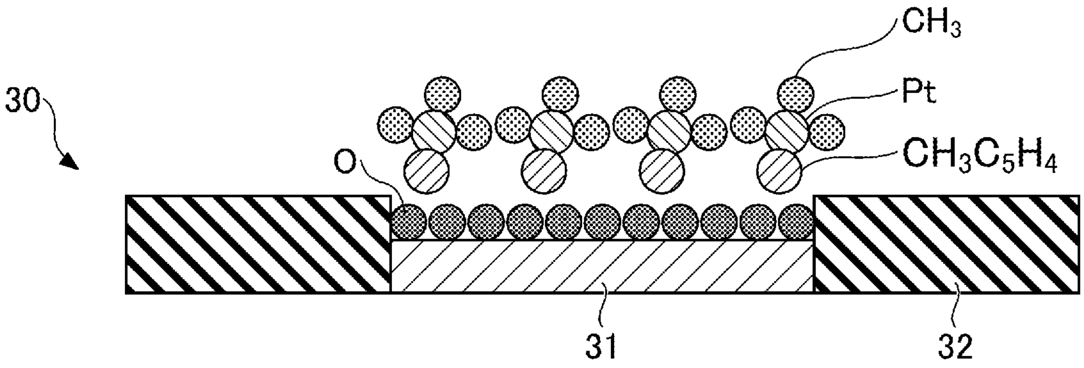
FIG. 19C is a cross-section view (2) illustrating an example of the method for substrate bonding according to the third embodiment.
Figure 19D:
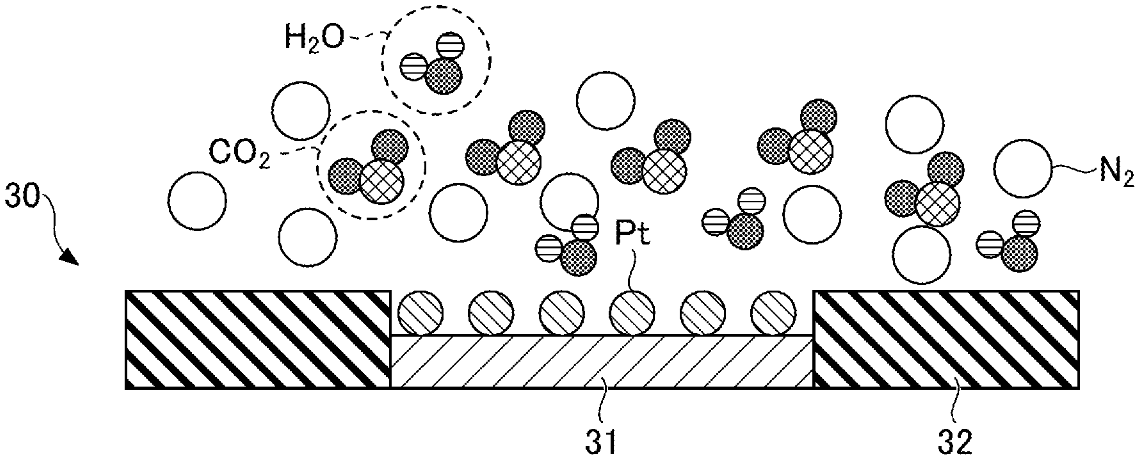
FIG. 19D is a cross-section view (2) illustrating an example of the method for substrate bonding according to the third embodiment.
Figure 19E:
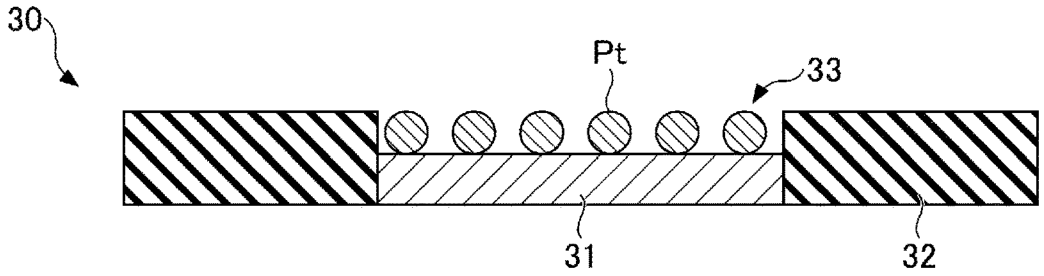
FIG. 19E is a cross-section view (2) illustrating an example of the method for substrate bonding according to the third embodiment.

Subsequently, the deposition process is performed on each substrate 30 on which the plasma processing is performed in the surface treatment module SM31 to selectively deposit the metal film 33 on the cleaned surface of the conductive layer 31. In the present embodiment, as illustrated in FIG. 19A, a process gas such as $O_2$ is supplied onto the substrate 30 in the deposition module DM31. The process gas may be also activated using a plasma formation apparatus. Further, as illustrated in FIG. 19B, the process gas such as $N_2$ is supplied onto the substrate 30 within the deposition module DM31. Further, as illustrated in FIG. 19C, the process gas such as $(CH_3C_5H_4)Pt(CH_3)_3$ is supplied onto the substrate 30 within the deposition module DM31. As illustrated in FIG. 19D, the process gas such as $N_2$ gas is supplied onto the substrate 30 within the deposition module DM31. Further, as illustrated in FIG. 19E, within the deposition module DM31, a purge gas such as $N_2$ gas is supplied onto the substrate 30 to remove a residual gas in proximity to the surface of the substrate 30. A metal film 33 is selectively deposited on the exposed surface of the insulating layer 32 by repeating the supply of the process gas, and the supply of the purge gas, onto the substrate 30. The metal film 33 includes, for example, Pt. At this time, the surface shape of the outermost surface of the substrate 30 can be controlled by changing the number of repetitions for the supply of the processing gas and the supply of the purge gas. For example, by increasing the number of repetitions, a film thickness of the metal film 33 formed on the exposed surface of the conductive layer 31 is increased, and the step on the outermost surface of the substrate 30 is reduced. The number of repetitions is set, for example, in accordance with the thermal expansion coefficient of a material that constitutes the conductive layer 31, the thermal expansion coefficient of a material that constitutes the insulating layer 32, and the temperature for heat treatment described below.

Subsequently, the gate valves G31*b* and G31*c* are opened, substrates 30 that are processed within the deposition module DM31 are transferred to the bonding module BM31 through the vacuum transfer robot in the vacuum transfer chamber TM31, and then the gate valves G31*b* and G31*c* are closed.

Figure 20A:
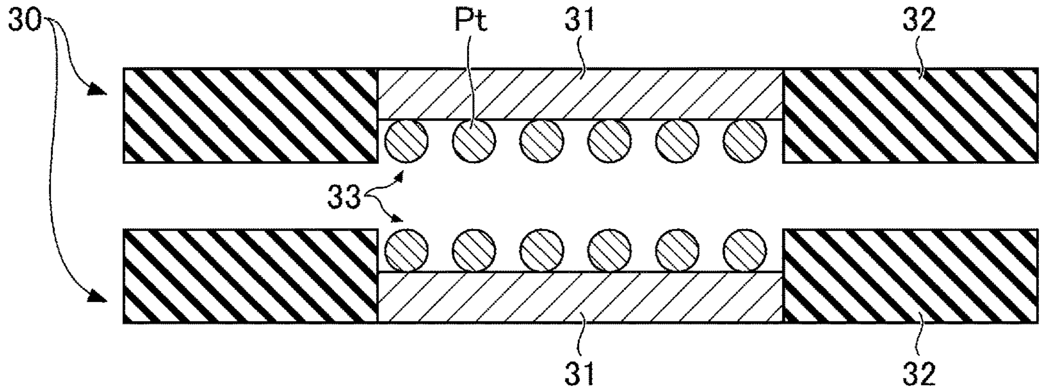
FIG. 20A is a cross-section view (3) illustrating an example of the method for substrate bonding according to the third embodiment.
Figure 20B:
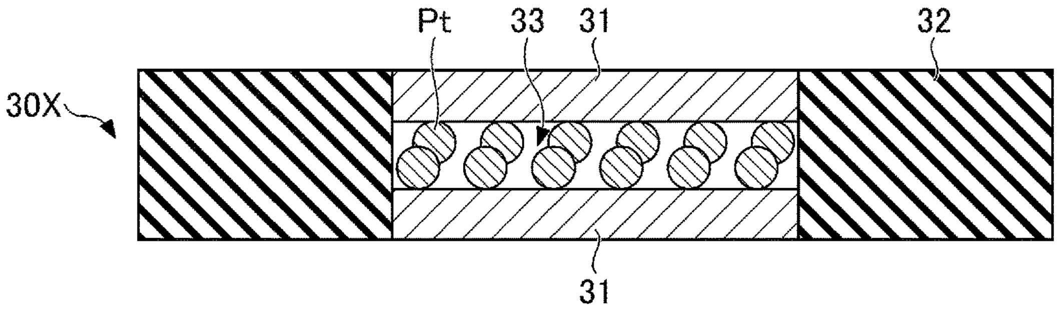
FIG. 20B is a cross-section view (3) illustrating an example of the method for substrate bonding according to the third embodiment.

Subsequently, the substrates 30 on which the deposition process is performed in the deposition module DM31 are bonded to form a bonded body 30X. In the present embodiment, as illustrated in FIG. 20A, within the bonding module BM31, the conductive layer 31 (metal film 33) and the insulating layer 32 of one substrate 30 are respectively positioned with respect to the conductive layer 31 (metal film 33) and the insulating layer 32 of the other substrate 30. After the positioning, two substrates 30 are bonded to form the bonded body 30X as illustrated in FIG. 20B.

Subsequently, the gate valves G31*c* and G31*d* are opened, and the bonded body 30X that is obtained within the bonding module BM31 is transferred to the heat treatment module AM31 through the vacuum transfer robot in the vacuum transfer chamber TM31, and then the gate valves G31*c* and G31*d* are closed.

Figure 20C:
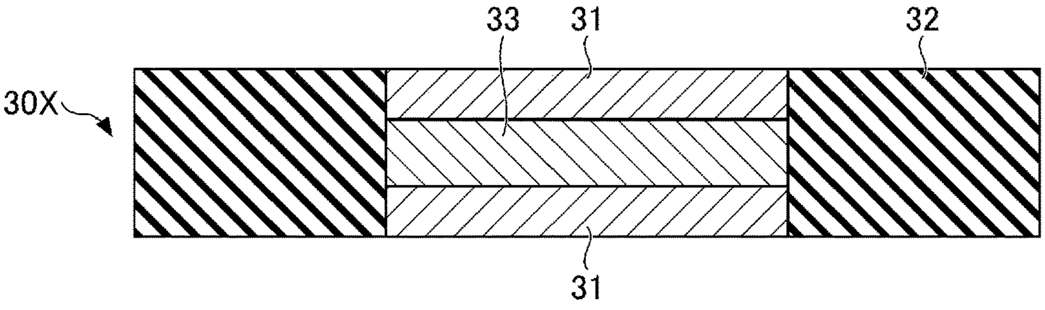
FIG. 20C is a cross-section view (3) illustrating an example of the method for substrate bonding according to the third embodiment.

Subsequently, the bonded body 30X that is formed in the bonding module BM31 is heat-treated. In the present embodiment, as illustrated in FIG. 20C, bonding strength of two substrates 30 that constitute the bonded body 30X is increased by heat-treating the bonded body 30X within the heat treatment module AM31.

Subsequently, the gate valves G31*d* and G31*f* are opened, the bonded body 30X that is heat-treated within the heat treatment module AM31 is transferred, for example, to the load-lock chamber LL31*b* through the vacuum transfer robot in the vacuum transfer chamber TM31, and then the gate valves G31*d* and G31*f* are closed. The load lock chamber LL31*a* may be used instead of the load lock chamber LL31*b*.

Subsequently, the interior of the load lock chamber LL31*b* is switched from the vacuum atmosphere to the ambient atmosphere, and the bonded body 30X is transferred from the interior of the load lock chamber LL31*a* to the outside of the substrate bonding system 3A.

According to the third embodiment described above, the upper surface of the conductive layer 31 and the upper surface of the insulating layer 32 are cleaned by performing plasma processing on the surface of each substrate 30. Then, the metal film 33 is selectively deposited on the cleaned surface of the conductive layer 31 to control the surface shape. Then, two substrates 30 are bonded by performing hybrid bonding in which conductive layers 31 (metal films 33) are bonded together with insulating layers 32 in a state where given surface shapes are controlled, thereby forming the bonded body 30X. With this approach, the contact area between the conductive layers 31 can be increased. As a result, contact resistance is reduced, and thus bonding strength is improved. That is, the conductive layers 31 can be bonded with high reliability.

Also, according to the third embodiment, the plasma processing in the surface treatment module, the selective deposition process in the deposition module, and the bonding processing in the bonding module are continuously performed in this order without exposing each substrate 30 to the atmosphere. Thus, contamination of the substrate 30, and oxidation of the surface of the conductive layer 31 and the like, during transfer between modules can be reduced. As a result, generation of fine defects (voids) caused by a contaminant or an oxide film at the interface surface of the bonded body 30X is reduced, and thus bonding strength is improved.

In addition, according to the third embodiment, the bonded body 30X is transferred from the bonding module to the heat treatment module without being exposed to the atmosphere, and is heat-treated after the bonding process. With this approach, productivity is improved and bonding strength is improved, in comparison to a case where the bonded body 30X is heat-treated outside the substrate bonding system.

Fourth Embodiment (Substrate Bonding System)

A first configuration example of the substrate bonding system according to the fourth embodiment will be described with reference to FIG. 21. The substrate bonding system illustrated in FIG. 21 is a cluster system in which processing modules are arranged in a star shape around a vacuum transfer chamber, and is a system in which each substrate is vacuum-transferred between various processing modules by using the vacuum transfer chamber, and then two substrates are bonded after performing predetermined processes on the substrate.

Figure 21:
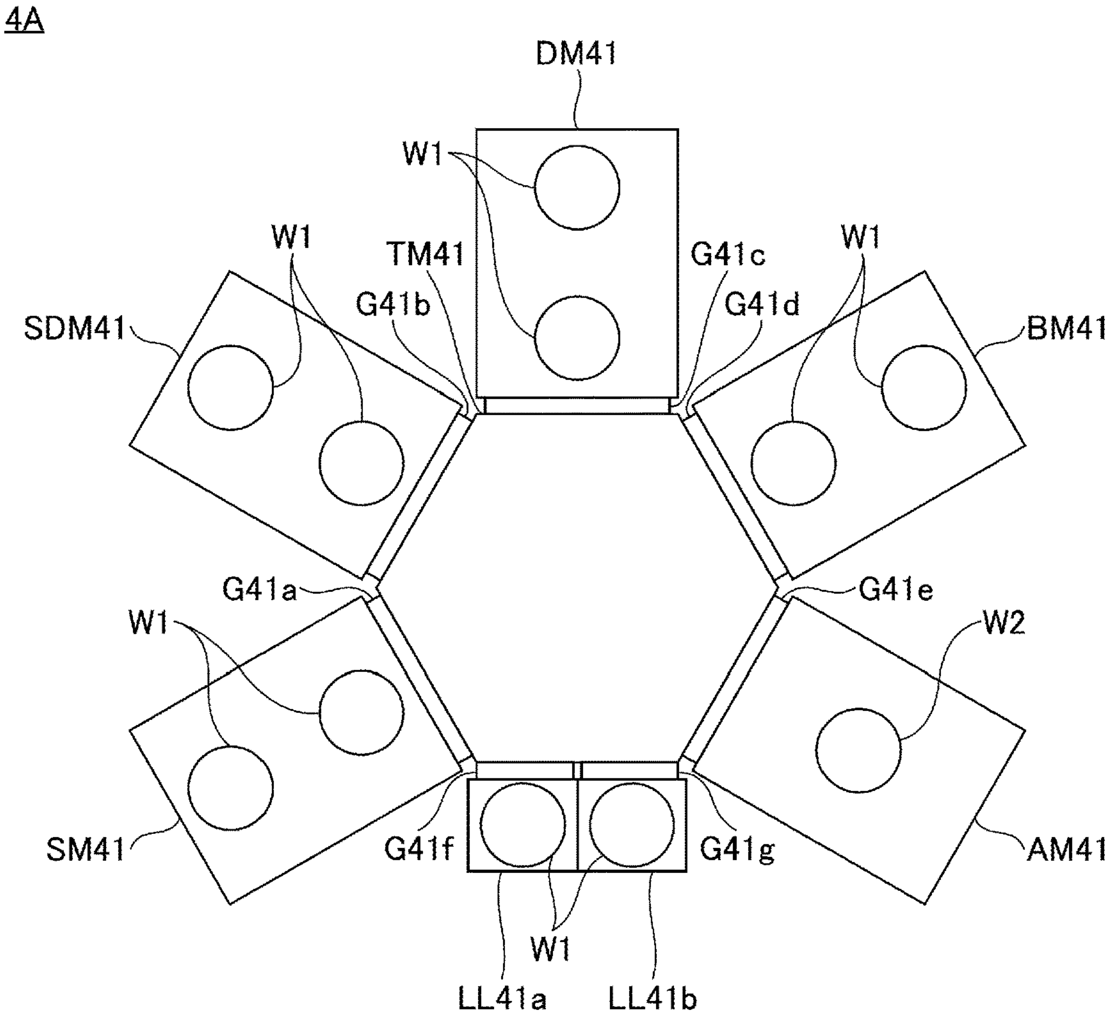
FIG. 21 is a diagram illustrating a first configuration example of the substrate bonding system according to a fourth embodiment.

As illustrated in FIG. 21, a substrate bonding system 4A includes a surface treatment module SM41, a SAM deposition module SDM41, a deposition module DM41, a bonding module BM41, a heat treatment module AM41, a vacuum transfer chamber TM41, and load lock chambers LL41*a* and LL41*b*, and the like.

The surface treatment module SM41, the SAM deposition module SDM41, the deposition module DM41, the bonding module BM41, and the heat treatment module AM41 are coupled to the vacuum transfer chamber TM41 via gate valves G41*a* to G41*e*, respectively. The load lock chambers LL41*a* and LL41*b* are coupled to the vacuum transfer chamber TM41 via gate valves G41*f* and G41*g*, respectively.

The surface treatment module SM41, the bonding module BM41, the heat treatment module AM41, the vacuum transfer chamber TM41, and the load lock chambers LL41*a* and LL41*b* may have the same configurations as the surface treatment module SM11, the bonding module BM11, the heat treatment module AM11, the vacuum transfer chamber TM11, and the load lock chambers LL11*a* and LL11*b* of the substrate bonding system 1A illustrated in FIG. 1, respectively.

The interior of the SAM deposition module SDM41 is depressurized to a predetermined vacuum atmosphere. The SAM deposition module SDM41 accommodates, for example, two substrates W1 therein, and deposits a SAM film on each of the two substrates W1. In the present embodiment, the SAM deposition module SDM41 is a module that deposits a SAM on the substrate W1, for example, by vapor deposition, MLD, or the like. Examples of the gas used in the MLD include a process gas such as N, N-Dimethyltrimethylsilylamine ($C_5H_{15}NSi$). In the present embodiment, the SAM is formed of an insulating material.

The interior of the deposition module DM41 is depressurized to a predetermined vacuum atmosphere. The deposition module DM41 accommodates, for example, two substrates W1 therein, and performs a deposition process on each of the two substrates W1 to selectively deposit a metal film in a predetermined region of the substrate W1. As described above, the deposition module DM11 is a processing module that selectively deposits the metal film in the predetermined region, and is also referred to as a selective deposition module. As the metal film, for example, manganese (Mn) is used. The insulating film is formed by, for example, ALD or CVD. Examples of the gas used in the ALD or the CVD include a process gas, such as Bis (N, N-diisopropylpentylamidinato) manganese (II), $H_2$, or $NH_3$, and a purge gas, such as $H_2$, $NH_3$, Ar, or $N_2$. The process gas and the purge gas may be also activated using a plasma formation apparatus. Examples of the plasma formation apparatus include a microwave plasma apparatus, an ICP apparatus, a CCP apparatus, and a SWP apparatus.

Figure 22:
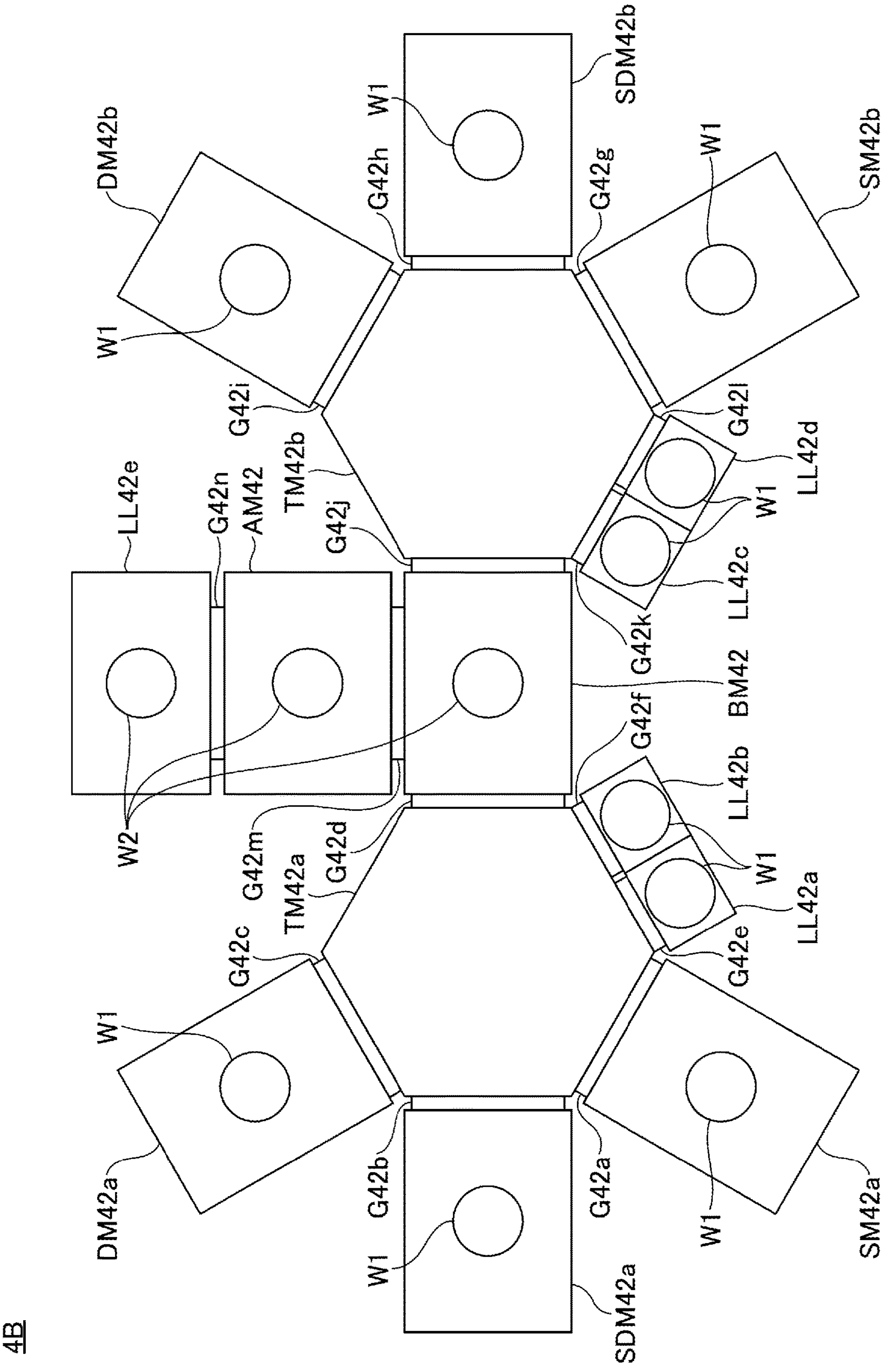
FIG. 22 is a diagram illustrating a second configuration example of the substrate bonding system according to the fourth embodiment.

A second configuration example of the substrate bonding system according to the fourth embodiment will be described with reference to FIG. 22. The substrate bonding system illustrated in FIG. 22 is a cluster system in which processing modules are arranged in a star shape around a vacuum transfer chamber, and is a system in which a substrate is vacuum-transferred between various processing modules by using the vacuum transfer chamber, and then two substrates are bonded after performing predetermined processes on the substrate. In the substrate bonding system illustrated in FIG. 22, each of the processing modules accommodates one substrate W1 therein, and performs a different process on the one substrate W1.

As illustrated in FIG. 22, a substrate bonding system 4B includes surface treatment modules SM42*a* and SM42*b*, SAM deposition modules SDM42*a* and SDM42*b*, deposition modules DM42*a* and DM42*b*, a bonding module BM42, a heat treatment module AM42, vacuum transfer chambers TM42*a* and TM42*b*, and load lock chambers LL42*a* to LL42*e*, and the like.

The surface treatment module SM42*a*, the SAM deposition module SDM42*a*, the deposition module DM42*a*, the bonding module BM42, and the load lock chambers LL42*a* and LL42*b* are coupled to the vacuum transfer chamber TM42*a* via gate valves G42*a* to G42*f*, respectively. The surface treatment module SM42*b*, the SAM deposition module SDM42*b*, the deposition module DM42*b*, the bonding module BM42, and the load lock chambers LL42*c* and LL42*d* are coupled to the vacuum transfer chamber TM42*b* via gate valves G42*g* to G421, respectively. The heat treatment module AM42 is coupled to the bonding module BM42 via a gate valve G42*m*, and is coupled to the load lock chamber LL42*e* via a gate valve G42*n*.

The surface treatment modules SM42*a* and SM42*b* may have the same configuration as the surface treatment module SM41, except that each of the surface treatment modules SM42*a* and SM42*b* accommodates one substrate W1 therein and performs a process on the substrate W1.

The SAM deposition modules SDM42*a* and SDM42*b* may have the same configuration as the SAM deposition module SDM41, except that each of the SAM deposition modules SDM42*a* and SDM42*b* accommodates one substrate W1 therein and performs a process on the substrate W1.

The deposition modules DM42*a* and DM42*b* may have the same configuration as the deposition module DM41, except that each of the deposition modules DM42*a* and DM42*b* accommodates one substrate W1 and performs a process on the substrate W1.

The bonding module BM42 and the heat treatment module AM42 may have the same configurations as the bonding module BM41 and the heat treatment module AM41, respectively.

In the vacuum transfer chamber TM42*a*, a vacuum transfer robot vacuum-transfers the substrate W1 between the surface treatment module SM42*a*, the SAM deposition module SDM42*a*, the deposition module DM42*a*, the bonding module BM42, and the load lock chambers LL42*a* and LL42*b*. In the vacuum transfer chamber TM42*b*, a vacuum transfer robot vacuum-transfers the substrate W1 between the surface treatment module SM42*b*, the SAM deposition module SDM42*b*, the deposition module DM42*b*, the bonding module BM42, and the load lock chambers LL42*c* and LL42*d*.

The load lock chambers LL42*a* to LL42*d* may have the same configuration as the load lock chambers LL41*a* and LL41*b*.

The interior of the load lock chamber LL42*e* can be switched between an ambient atmosphere and a vacuum atmosphere. In the load lock chamber LL42*e*, the bonded body W2 is transferred to the outside of the substrate bonding system 4B.

A third configuration example of the substrate bonding system according to the fourth embodiment will be described with reference to FIG. 23. The substrate bonding system illustrated in FIG. 23 is an in-line system in which processing modules are arranged in series, and is a system in which two substrates are bonded after each of the processing modules performs a predetermined process on the substrates without exposing the substrates to the air.

Figure 23:
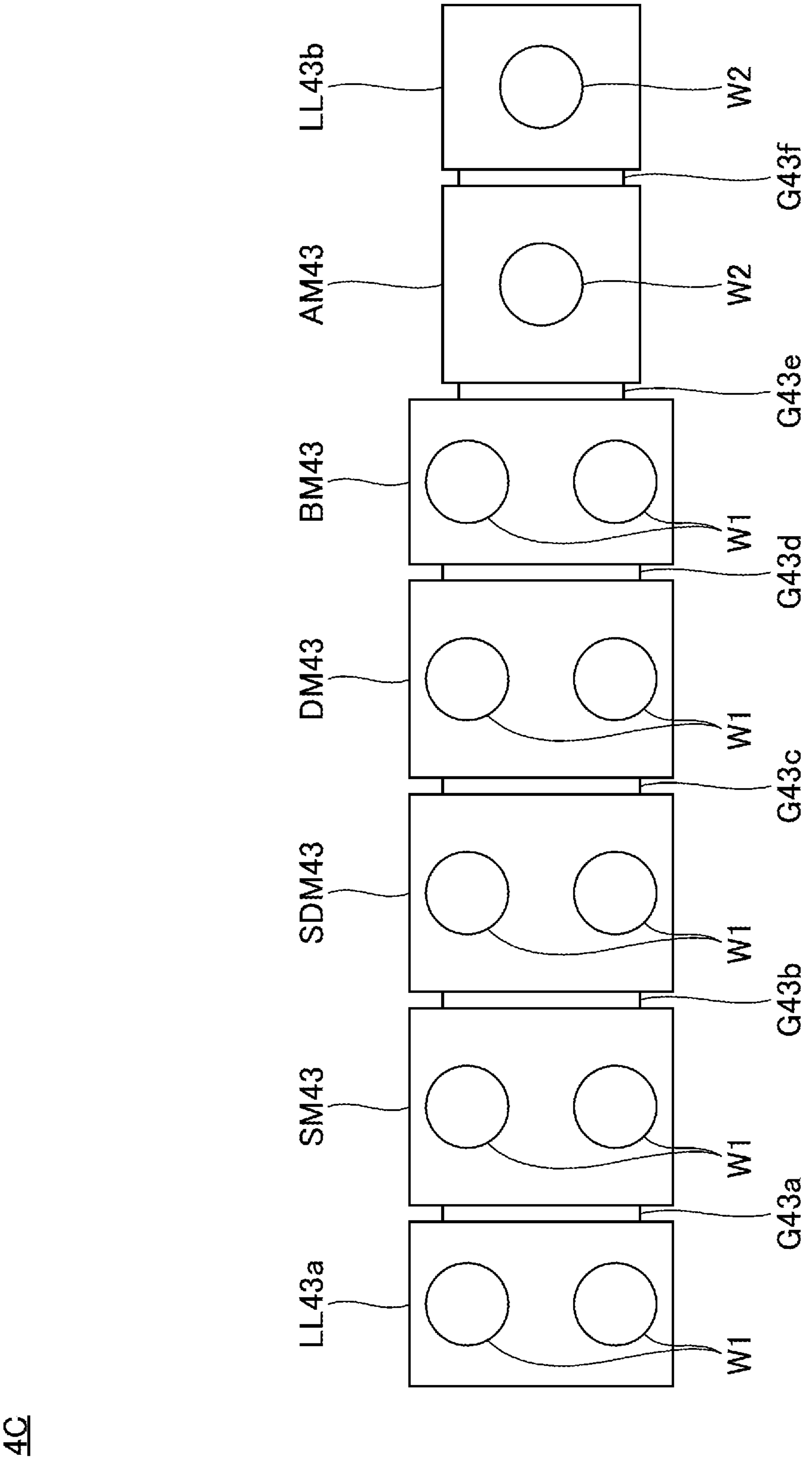
FIG. 23 is a diagram illustrating a third configuration example of the substrate bonding system according to the fourth embodiment.

As illustrated in FIG. 23, a substrate bonding system 4C includes load lock chambers LL43*a* and LL43*b*, a surface treatment module SM43, a SAM deposition module SDM43, a deposition module DM43, a bonding module BM43, and a heat treatment module AM43, and the like.

The load lock chamber LL43*a*, the surface treatment module SM43, the SAM deposition module SDM43, the deposition module DM43, the bonding module BM43, the heat treatment module AM43, and the load lock chamber LL43*b* are arranged in a line in this order.

The interior of the load lock chamber LL43*a* can be switched between an ambient atmosphere and a vacuum atmosphere. Substrates W1 are transferred to the load lock chamber LL43*a* from outside of the substrate bonding system 4C.

The surface treatment module SM43 is coupled to the load lock chamber LL43*a* via a gate valve G43*a*. The substrates W1 are vacuum-transferred from the load lock chamber LL43*a* to the surface treatment module SM43. The surface treatment module SM43 may have the same configuration as the surface treatment module SM41.

The SAM deposition module SDM43 is coupled to the surface treatment module SM43 via a gate valve G43*b*. The substrates W1 are vacuum-transferred from the surface treatment module SM43 to the SAM deposition module SDM43. The SAM deposition module SDM43 may have the same configuration as the SAM deposition module SDM41.

The deposition module DM43 is coupled to the SAM deposition module SDM43 via a gate valve G43*c*. The substrates W1 are vacuum-transferred from the SAM deposition module SDM43 to the deposition module DM43. The deposition module DM43 may have the same configuration as the deposition module DM41.

The bonding module BM43 is coupled to the deposition module DM43 via a gate valve G43*d*. The substrates W1 are vacuum-transferred from the deposition module DM43 to the bonding module BM43. The bonding module BM43 may have the same configuration as the bonding module BM41.

The heat treatment module AM43 is coupled to the bonding module BM43 via a gate valve G43*e*. A bonded body W2 is vacuum-transferred from the bonding module BM43 to the heat treatment module AM43. The heat treatment module AM43 may have the same configuration as the heat treatment module AM41.

The load lock chamber LL43*b* is coupled to the heat treatment module AM43 via a gate valve G43*f*. The bonded body W2 is vacuum-transferred from the heat treatment module AM43 to the load lock chamber LL43*b*. The interior of the load lock chamber LL43*b* can be switched between an ambient atmosphere and a vacuum atmosphere. In the load lock chamber LL43*b*, the bonded body W2 that is heat-treated in the heat treatment module AM43 is transferred to the outside of the substrate bonding system 4C.

A fourth configuration example of the substrate bonding system according to the fourth embodiment will be described with reference to FIG. 24. The substrate bonding system illustrated in FIG. 24 is an in-line system in which processing modules are arranged in series, and is a system in which two substrates are bonded after each of the processing modules performs a predetermined process on a substrate without exposing the substrate to the atmosphere.

Figure 24:
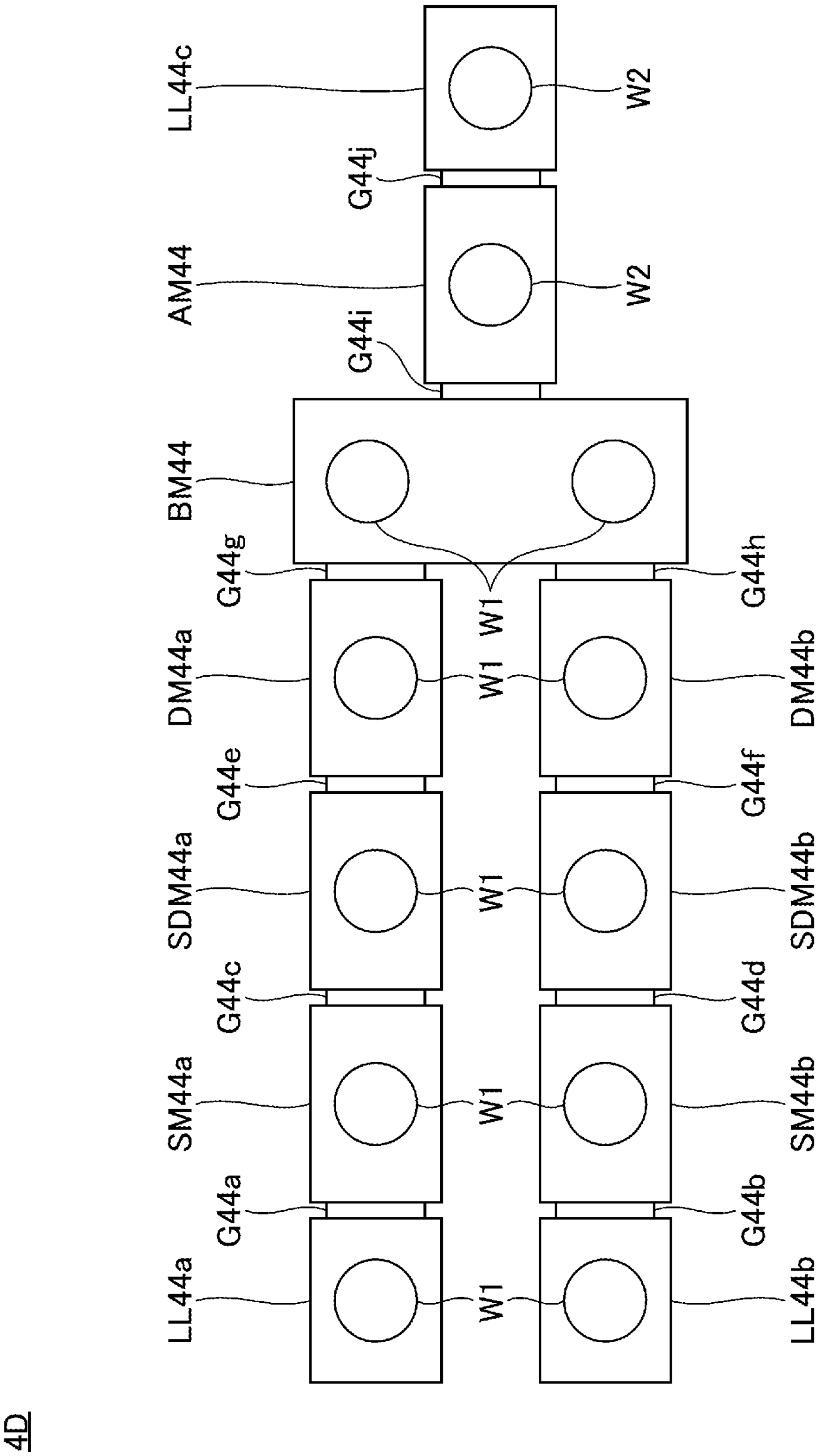
FIG. 24 is a diagram illustrating a fourth configuration example of the substrate bonding system according to the fourth embodiment.

As illustrated in FIG. 24, a substrate bonding system 4D includes load-lock chambers LL44*a* to LL44*c*, surface treatment modules SM44*a* and SM44*b*, SAM deposition modules SDM44*a* and SDM44*b*, deposition modules DM44*a* and DM44*b*, a bonding module BM44, and a heat treatment module AM44, and the like.

The load lock chamber LL44*a*, the surface treatment module SM44*a*, the SAM deposition module SDM44*a*, and the deposition module DM44*a* are arranged in a line in this order, and the deposition module DM44*a* is coupled to the bonding module BM44. The load lock chamber LL44*b*, the surface treatment module SM44*b*, the SAM deposition module SDM44*b*, and the deposition module DM44*b* are arranged in a line in this order, and the deposition module DM44*b* is coupled to the bonding module BM44. The load lock chamber LL44*a*, the surface treatment module SM44*a*, the SAM deposition module SDM44*a*, and the deposition module DM44*a* are arranged in parallel with the load lock chamber LL44*b*, the surface treatment module SM44*b*, the SAM deposition module SDM44*b*, and the deposition module DM44*b*.

The interior of each of the load lock chambers LL44*a* and LL44*b* can be switched between an ambient atmosphere and a vacuum atmosphere. A substrate W1 is transferred to each of the load lock chambers LL44*a* and LL44*b* from outside of the substrate bonding system 4D.

The surface treatment modules SM44*a* and SM44*b* are coupled to the load lock chambers LL44*a* and LL44*b* via gate valves G44*a* and G44*b*, respectively. Substrates W1 are vacuum-transferred from the load lock chambers LL44*a* and LL44*b* to the surface treatment modules SM44*a* and SM44*b*, respectively. The surface treatment modules SM44*a* and SM44*b* may have the same configuration as the surface treatment modules SM42*a* and SM42*b*.

The SAM deposition modules SDM44*a* and SDM44*b* are coupled to the surface treatment modules SM44*a* and SM44*b* via gate valves G44*c* and G44*d*, respectively. The substrates W1 are vacuum-transferred from the surface treatment modules SM44*a* and SM44*b* to the SAM deposition modules SDM44*a* and SDM44*b*, respectively. The SAM deposition modules SDM44*a* and SDM44*b* may have the same configuration as the SAM deposition modules SDM42*a* and SDM42*b*.

The deposition modules DM44*a* and DM44*b* are coupled to the SAM deposition modules SDM44*a* and SDM44*b* via gate valves G44*e* and G44*f*, respectively. The substrates W1 are vacuum-transferred from the SAM deposition modules SDM44*a* and SDM44*b* to the deposition modules DM44*a* and DM44*b*, respectively. The deposition modules DM44*a* and DM44*b* may have the same configuration as the deposition modules DM42*a* and DM42*b*.

The bonding module BM44 is coupled to the deposition modules DM44*a* and DM44*b* via respective gate valves G44*g* and G44*h*. The substrate W1 is vacuum-transferred from each of the deposition modules DM44*a* and DM44*b* to the bonding module BM44. The bonding module BM44 may have the same configuration as the bonding module BM42.

The heat treatment module AM44 is coupled to the bonding module BM44 via a gate valve G44*i*. A bonded body W2 is vacuum-transferred from the bonding module BM44 to the heat treatment module AM44. The heat treatment module AM44 may have the same configuration as the heat treatment module AM42.

The load lock chamber LL44*c* is coupled to the heat treatment module AM44 via a gate valve G44*j*. The bonded body W2 is vacuum-transferred from the heat treatment module AM44 to the load lock chamber LL44*c*. The load lock chamber LL44*c* may have the same configuration as the load lock chamber LL42*e*.

(Method for Substrate Bonding)

As an example of the method for substrate bonding according to the fourth embodiment, a case where substrates are bonded by the substrate bonding system 4A illustrated in FIG. 21 will be described with reference to FIG. 25A and FIG. 25B, FIGS. 26A to 26D, and FIGS. 27A to 27C. In each of the substrate bonding systems 4B to 4D illustrated in FIG. 22 to FIG. 24, substrates can be bonded as in the substrate bonding system 4A.

Figure 25A:
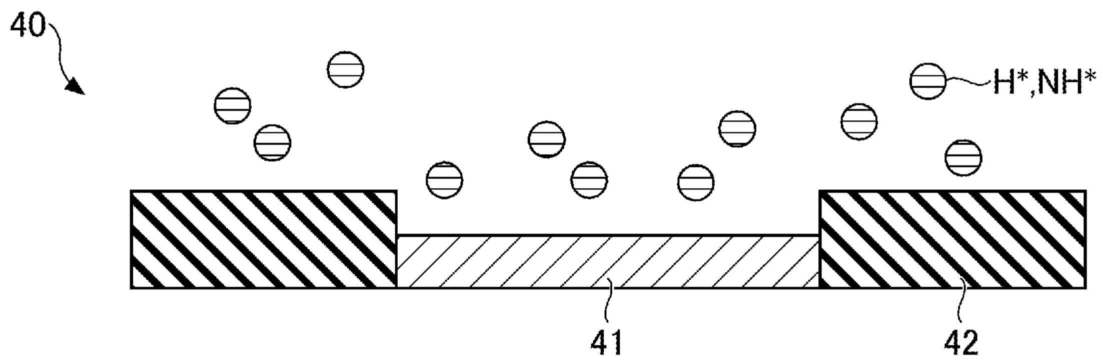
FIG. 25A is a cross-section view (1) illustrating an example of the method for substrate bonding according to the fourth embodiment.

Each substrate 40 is first prepared. In the present embodiment, as illustrated in FIG. 25A, the upper surface of the substrate 40 has a conductive layer 41 and an insulating layer 42. A step at which the upper surface of the conductive layer 41 is recessed with respect to the upper surface of the insulating layer 42 is formed between the upper surface of the conductive layer 41 and the upper surface of the insulating layer 42. The conductive layer 41 is formed, for example, of Cu. The conductive layer 41 may include, for example, a line or an electrode pad. The insulating layer 42 is formed, for example, of a low-k material. The insulating layer 42 may include, for example, an interlayer dielectric film. For example, a corrosion-inhibiting film (not illustrated) is formed on the substrate 40 as a protective film, so as to cover at least the upper surface of the conductive layer 41. The corrosion-inhibiting film is formed by CMP that uses a polishing slurry containing a corrosion inhibitor such as BTA. The protective film need not be formed on the substrate 40.

Subsequently, the interior of each of the load lock chambers LL41*a* and LL41*b* is switched to the ambient atmosphere. Then, the prepared substrate 40 is transferred, for example, to each of the load lock chambers LL41*a* and LL41*b*. Subsequently, the interior of each of the load lock chambers LL41*a* and LL41*b* in which the substrate 40 is accommodated is switched from the ambient atmosphere to the vacuum atmosphere. Subsequently, the gate valves G41*f*, G41*g*, and G41*a* are opened, the substrate 40 within each of the load lock chambers LL41*a* and LL41*b* is transferred to the surface treatment module SM41 through the vacuum transfer robot in the vacuum transfer chamber TM41, and then the gate valves G41*f*, G41*g*, and G41*a* are closed.

Subsequently, the plasma processing is performed on the surface of each substrate 40. With this approach, the upper surface of the conductive layer 41 and the upper surface of the insulating layer 42 are cleaned. In the present embodiment, as illustrated in FIG. 25A, within the surface treatment module SM41, the upper surface of the conductive layer 41 and the upper surface of the insulating layer 42 are exposed by supplying radicals, such as H radicals (H*) or NH radicals (NH*), onto the substrate 40, and by removing a contaminant, a natural oxide film, or a corrosion-inhibiting film, or the like that is generated on the surface of the substrate 40.

Subsequently, the gate valves G41*a* and G41*b* are opened, substrates 40 that are processed within the surface treatment module SM41 are transferred to the SAM deposition module SDM41 through the vacuum transfer robot in the vacuum transfer chamber TM41, and then the gate valves G41*a* and G41*b* are closed.

Figure 25B:
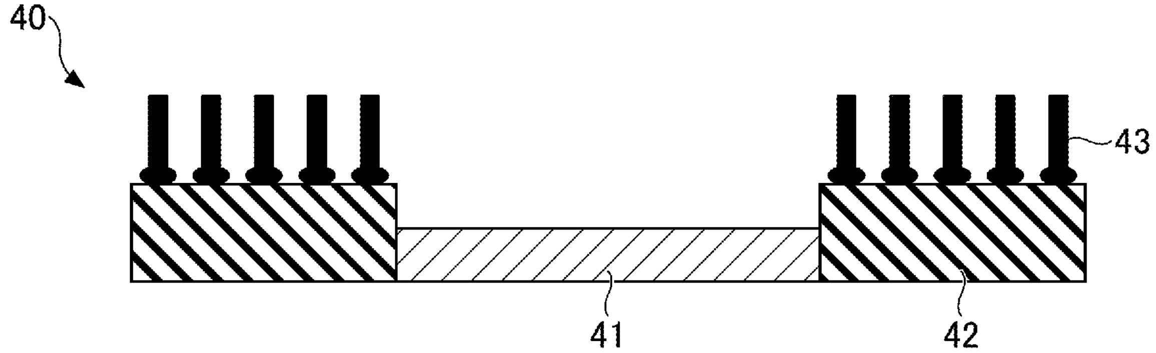
FIG. 25B is a cross-section view (1) illustrating an example of the method for substrate bonding according to the fourth embodiment.

Subsequently, the deposition process is performed on each substrate 40 on which plasma processing is performed in the surface treatment module SM41 to selectively deposit a SAM 43 on the cleaned surface of the insulating layer 42. In the present embodiment, as illustrated in FIG. 25B, a process gas such as $C_5H_{15}NSi$ is supplied onto the substrate 40 within the SAM deposition module SDM41 to selectively deposit the SAM 43 on an exposed surface of the insulating layer 42.

Subsequently, the gate valves G41*b* and G41*c* are opened, the substrates 40 that are processed within the SAM deposition module SDM41 are transferred to the deposition module DM41 by the vacuum transfer robot in the vacuum transfer chamber TM11, and then the gate valves G41*b* and G41*c* are closed.

Figure 26A:
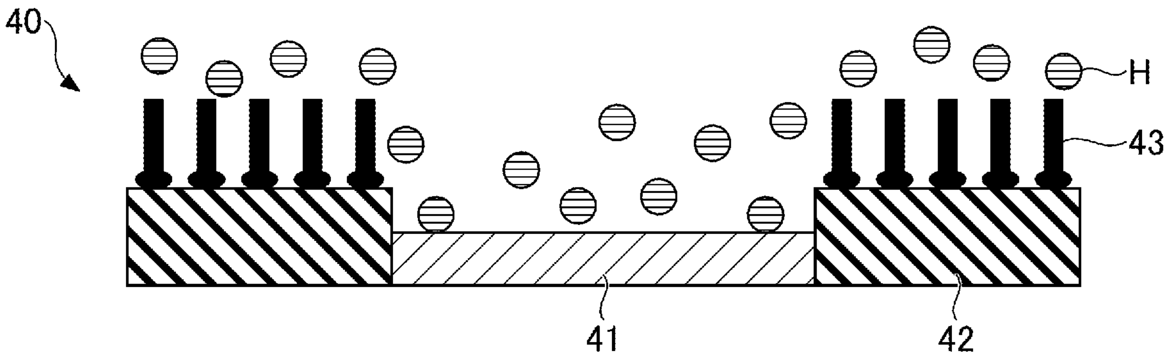
FIG. 26A is a cross-section view (2) illustrating an example of the method for substrate bonding according to the fourth embodiment.
Figure 26B:
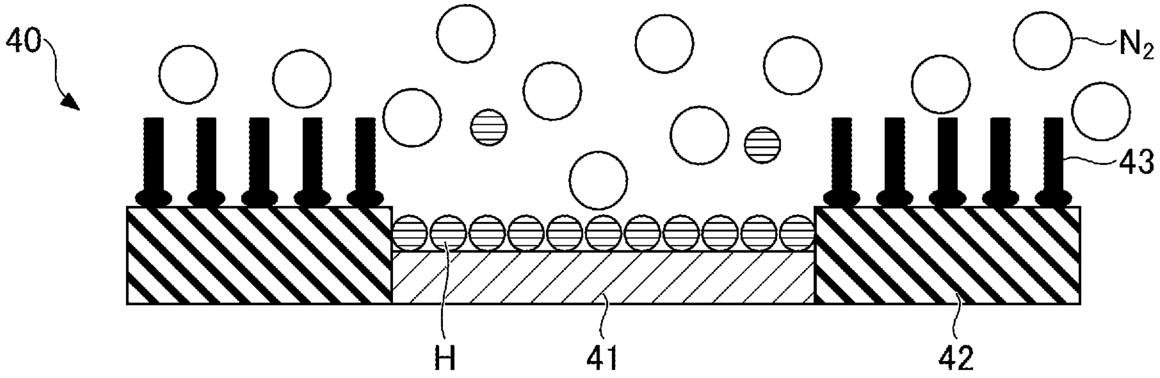
FIG. 26B is a cross-section view (2) illustrating an example of the method for substrate bonding according to the fourth embodiment.
Figure 26C:
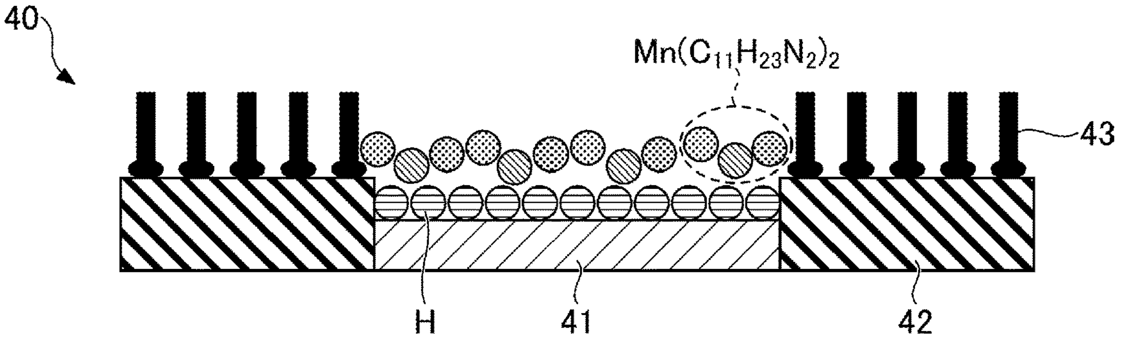
FIG. 26C is a cross-section view (2) illustrating an example of the method for substrate bonding according to the fourth embodiment.
Figure 26D:
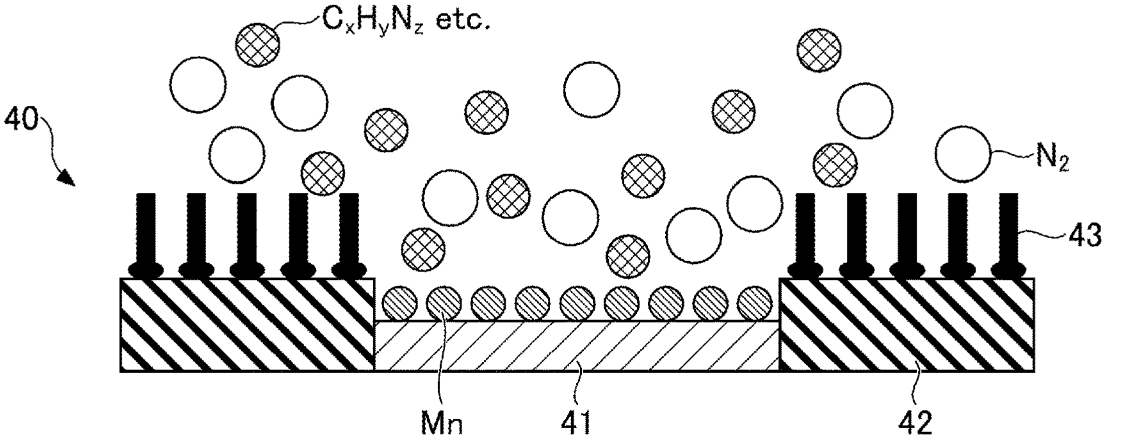
FIG. 26D is a cross-section view (2) illustrating an example of the method for substrate bonding according to the fourth embodiment.

Subsequently, the deposition process is performed on each substrate 40 on which the SAM 43 is formed in the SAM deposition module SDM41, thereby selectively depositing a metal film 44 on the cleaned surface of the conductive layer 41. In the present embodiment, as illustrated in FIG. 26A, a process gas such as $H_2$ or $NH_3$ is supplied onto the substrate 40 within the deposition module DM41. Further, the interior of the deposition module DM41 is evacuated. With this approach, as illustrated in FIG. 26B, the upper surface of the conductive layer 41 becomes in a state where H groups are adsorbed on the upper surface of the conductive layer 41. Also, as illustrated in FIG. 26C, a process gas, such as Bis (N or N-diisopropylpentylamidinato) manganese (II) $[Mn(C_{11}H_{23}N_2)_2]$, is supplied onto the substrate 40. Further, as illustrated in FIG. 26D, a purge gas such as $H_2$, $NH_3$, Ar, or $N_2$ is supplied onto the substrate 40. The purge gas may be also activated using a plasma formation apparatus. In such a manner, by repeating the supply of the process gas, and the supply of the purge gas, onto the substrate 40, a metal film 44 is selectively deposited on the exposed surface of the conductive layer 41, and the SAM 43 is desorbed from the exposed surface of the insulating layer 42. The metal film 44 includes, for example, a Mn film. At this time, the surface shape of the outermost surface of the substrate 40 can be controlled by changing the number of repetitions for the supply of the process gas and the supply of the purge gas. For example, by increasing the number of repetitions, a film thickness of the metal film 44 that is deposited on the exposed surface of the conductive layer 41 is increased, and the step on the outermost surface of the substrate 40 is reduced. The number of repetitions is set, for example, in accordance with the thermal expansion coefficient of a material that constitutes the conductive layer 41, the thermal expansion coefficient of a material that constitutes the insulating layer 42, and the temperature for heat treatment described below.

Subsequently, the gate valves G41*c* and G41*d* are opened, substrates 40 that are processed within the deposition module DM41 are transferred to the bonding module BM41 through the vacuum transfer robot in the vacuum transfer chamber TM41, and then the gate valves G41*c* and G41*d* are closed.

Figure 27A:
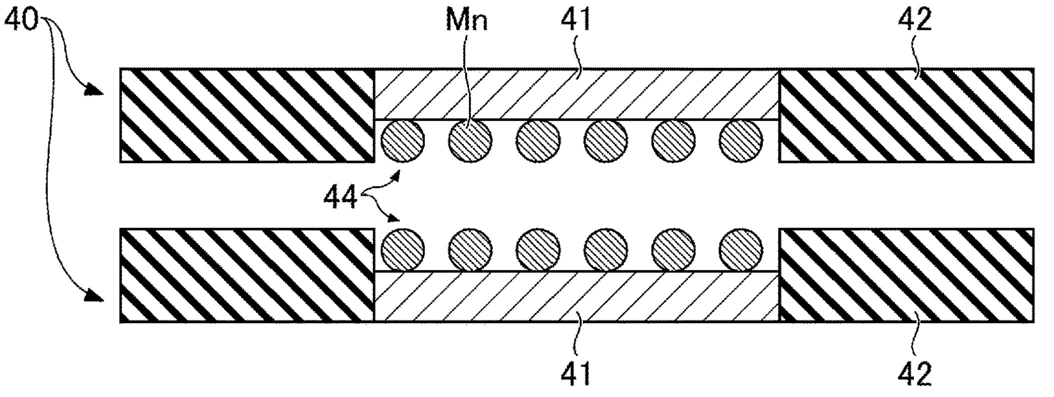
FIG. 27A is a cross-section view (3) illustrating an example of the method for substrate bonding according to the fourth embodiment.
Figure 27B:
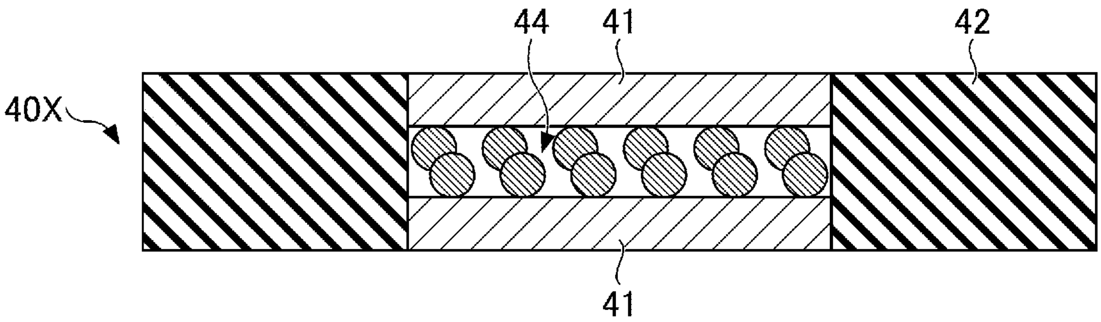
FIG. 27B is a cross-section view (3) illustrating an example of the method for substrate bonding according to the fourth embodiment.

Subsequently, the substrates 40 on which the deposition process is performed in the deposition module DM41 are bonded to form a bonded body 40X. In the present embodiment, as illustrated in FIG. 27A, within the bonding module BM41, the conductive layer 41 (metal film 44) and the insulating layer 42 of one substrate 40 are respectively positioned with respect to the conductive layer 41 (metal film 44) and the insulating layer 42 of the other substrate 40. After the positioning, two substrates 40 are bonded to form the bonded body 40X as illustrated in FIG. 27B.

Subsequently, the gate valves G41*d* and G41*e* are opened, the bonded body 40X that is obtained within the bonding module BM41 is transferred to the heat treatment module AM41 through the vacuum transfer robot in the vacuum transfer chamber TM41, and then the gate valves G41*d* and G41*e* are closed.

Figure 27C:
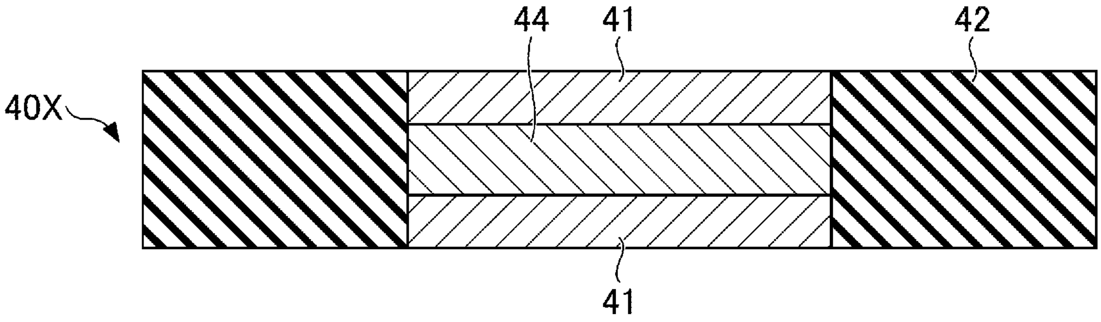
FIG. 27C is a cross-section view (3) illustrating an example of the method for substrate bonding according to the fourth embodiment.

Subsequently, the bonded body 40X that is formed in the bonding module BM41 is heat-treated. In the present embodiment, as illustrated in FIG. 27C, bonding strength of two substrates 40 that constitute the bonded body 40X is increased by performing heat-treating the bonded body 40X within the heat treatment module AM41.

Subsequently, the gate valves G41*e* and G41*g* are opened, the bonded body 40X heat-treated within the heat treatment module AM41 is transferred, for example, to the load-lock chamber LL41*b* through the vacuum transfer robot in the vacuum transfer chamber TM41, and then the gate valves G41*e* and G41*g* are closed. The load lock chamber LL41*a* may be used instead of the load lock chamber LL41*b*.

Subsequently, the interior of the load lock chamber LL41*b* is switched from the vacuum atmosphere to the ambient atmosphere, and then the bonded body 40X is transferred from the interior of the load lock chamber LL41*a* to the outside of the substrate bonding system 2A.

According to the fourth embodiment described above, the upper surface of the conductive layer 41 and the upper surface of the insulating layer 42 are cleaned by performing plasma processing on the surface of each substrate 40. Then, the metal film 44 is selectively deposited on the cleaned surface of the conductive layer 41 to control the surface shape. Then, two substrates 40 are bonded to form the bonded body 40X by performing hybrid bonding in which conductive layers 41 (metal films 44) are bonded together with insulating layers 42 in a state where given surface shapes are controlled. With this approach, the contact area between the conductive layers 41 can be increased. As a result, contact resistance is reduced, and bonding strength is improved. That is, the conductive layers 41 can be bonded with high reliability.

According to the fourth embodiment, the plasma processing in the surface treatment module, the deposition process in the SAM deposition module, the deposition process in the deposition module, and the bonding process in the bonding module are continuously performed in this order without exposing substrates 40 to the atmosphere. With this approach, contamination of each substrate 40, and oxidation of the surface of the conductive layer 41 and the like, during transfer between modules can be reduced. As a result, generation of fine defects (voids) caused by a contaminant or an oxide film at the interface surface of the bonded body 40X is reduced, and thus bonding strength is improved.

Also, according to the fourth embodiment, the bonded body 40X is transferred from the bonding module to the heat treatment module without being exposed to the atmosphere, and is heat-treated after the bonding process. With this approach, productivity is improved and bonding strength is improved, in comparison to a case where the bonded body 40X is heat-treated outside the substrate bonding system.

It should be understood that the embodiments disclosed herein are illustrative in all respects, and are not restrictive. Omissions, substitutions, and changes in the various forms of the above embodiments may be made without departing from the scope and spirit of the appended claims.

The above embodiments are described using a case where, when one or more substrates are transferred between various processing modules, the substrates are transferred to be in the vacuum atmosphere. However, the present disclosure is not limited to the manner described above. For example, when each substrate is transferred between various processing modules, the substrate may be transferred to be in an inert gas atmosphere, or the atmosphere in which a dew point is controlled.

Figure 28A:
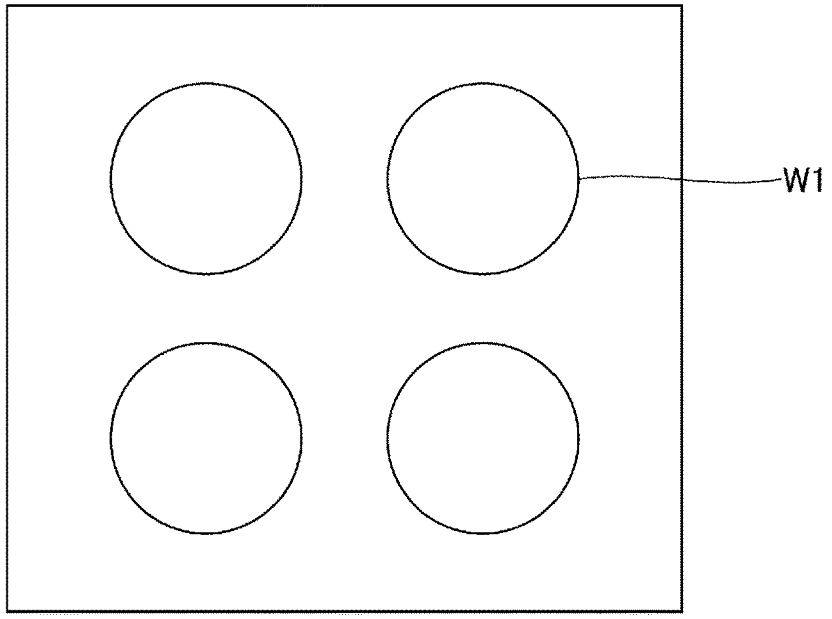
FIG. 28A is a diagram illustrating a processing module according to a modification.
Figure 28B:
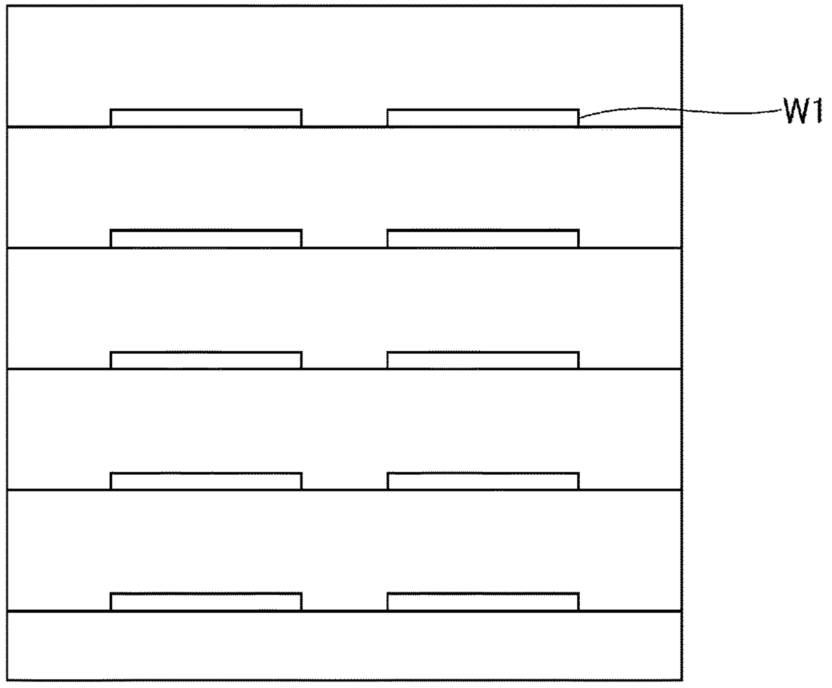
FIG. 28B is a diagram (1) illustrating the processing module according to the modification.

Although the embodiments are described using the case where various processing modules are configured to accommodate one or two substrates and perform a process on the substrates, the present disclosure is not limited thereto. For example, each processing module may be configured to accommodate and process three or more substrates. For example, when each processing module accommodates and processes a plurality of substrates, processing modules can simultaneously process substrates W1 such that the substrates W1 are horizontally arranged and vertically arranged in multiple stages, as illustrated in FIG. 28A and FIG. 28B. FIG. 28A is a top view of a given processing module, and FIG. 28B is a side view of the given processing module. In these figures, illustration of walls such as a top wall and side walls is omitted for purposes of visually recognizing the inside of the given processing module.

Although the first embodiment is described using the case where the insulating film 13 deposited on the exposed surface of the insulating layer 12 includes $SiO_2$, the present disclosure is not limited thereto. Examples of a combination (insulating film 13/insulating layer 12) of the insulating layer 12 and the insulating film 13 include $Al_2O_3/SiO_2$, SiOF/SiOC, $ZrO_2/SiO_2$, $TiO_2/SiO_2$, and $TiN/SiO_2$.

In the second embodiment, examples of the SAM 23 that is deposited on the exposed surface of the conductive layer 21 include alkanethiols [R—SH], amines [R—NH], phosphonic acids [R—$PO(OH)_2$], carboxylic acids [R—COOH], and alcohols [R—OH].

Although the third embodiment is described using the case where the metal film 33 formed on the exposed surface of the conductive layer 31 includes Pt, the present disclosure is not limited thereto. Examples of a combination (metal film 33/conductive layer 31) of the conductive layer 31 and the metal film 33 include Ni/Cu, Au/Cu, Pd/Cu, and Mn/Cu.

In the fourth embodiment, in a case where the insulating layer 42 includes an oxide film, examples of the SAM 43 formed on the exposed surface of the insulating layer 42 include alkyl silane [R—$SiH_3$], alkyl trichlorosilane [R—$SiCl_3$], and silane coupling agents [R—$Si(OR)_3$], In addition, in a case where the insulating layer 42 includes a nitride film, for example, alkene [R—CH═$CH_2$], or alkyl bromides may be used.

The present international application claims priority to Japanese Patent Application No. 2020-217832, filed Dec. 25, 2020, the contents of which are incorporated herein by reference in their entirety.

REFERENCE SIGNS LIST

1A to 1D, 2A to 2D, 3A to 3D, 4A to 4D substrate bonding system SM surface treatment module DM deposition module BM bonding module

The invention claimed is:

1. A substrate bonding system comprising:

a surface treatment module configured to perform plasma processing on surfaces of a first substrate and a second substrate;

a deposition module coupled to the surface treatment module such that each of the first substrate and the second substrate is transferred to the deposition module without being exposed to atmosphere, the deposition module being configured to perform a deposition process on the surfaces of the first substrate and the second substrate on which the plasma processing is performed in the surface treatment module; and a bonding module coupled to the deposition module such that each of the first substrate and the second substrate is transferred to the bonding module without exposing the first substrate and the second substrate to the atmosphere, the bonding module being configured to bond, with respect to the first substrate and the second substrate on which the deposition process is performed in the deposition module, (i) respective conductor layers on the first substrate and the second substrate to each other and (ii) respective insulating layers on the first substrate and the second substrate to each other, to form a bonded body.

2. The substrate bonding system according to claim 1, wherein the substrate bonding system is a cluster system.

3. The substrate bonding system according to claim 2, further comprising:

a vacuum transfer chamber coupled to the surface treatment module, the deposition module, and the bonding module, wherein each of the first substrate and the second substrate is configured to be vacuum-transferred between the surface treatment module, the deposition module, and the bonding module, by using the vacuum transfer chamber.

4. The substrate bonding system according to claim 1, wherein the substrate bonding system is an in-line system.

5. The substrate bonding system according to claim 1, wherein the deposition module is a module configured to deposit respective insulating films on the first substrate and the second substrate.

6. The substrate bonding system according to claim 1, wherein the deposition module is a module configured to deposit metal films on the respective conductor layers.

7. A substrate bonding system comprising:

a surface treatment module configured to perform plasma processing on surfaces of a first substrate and a second substrate;

a first deposition module coupled to the surface treatment module such that each of the first substrate and the second substrate is transferred to the first deposition module without being exposed to atmosphere, the first deposition module being configured to form a self-assembled monolayer film (SAM) on the first substrate and the second substrate on which the plasma processing is performed in the surface treatment module;

a second deposition module coupled to the first deposition module such that each of the first substrate and the second substrate is transferred to the second deposition module without being exposed to the atmosphere, the second deposition module being configured to perform a deposition process on each of the first substrate and the second substrate on which the self-assembled monolayer film is formed in the first deposition module; and a bonding module coupled to the second deposition module such that each of the first substrate and the second substrate is transferred to the bonding module without exposing the first substrate and the second substrate to the atmosphere, the bonding module being configured to bond the first substrate and the second substrate on which the deposition process is performed in the deposition module, to form a bonded body.

8. The substrate bonding system according to claim 7, wherein the substrate bonding system is a cluster system.

9. The substrate bonding system according to claim 8, further comprising:

a vacuum transfer chamber coupled to the surface treatment module, the first deposition module, the second deposition module, and the bonding module, wherein each of the first substrate and the second substrate is configured to be vacuum-transferred between the surface treatment module, the first deposition module, the second deposition module, and the bonding module, by using the vacuum transfer chamber.

10. The substrate bonding system according to claim 7, wherein the substrate bonding system is an in-line system.

11. The substrate bonding system according to claim 7, wherein the second deposition module is a module configured to deposit an insulating film on each of the first substrate and the second substrate.

12. The substrate bonding system according to claim 7, wherein the second deposition module is a module configured to deposit a metal film on each of the first substrate and the second substrate.

13. The substrate bonding system according to claim 1, further comprising:

a heat treatment module coupled to the bonding module such that each of the first substrate and the second substrate is transferred to the heat treatment module without being exposed to the atmosphere, the heat treatment module being configured to heat-treat the bonded body formed in the bonding module.

14. A method for substrate bonding comprising:

(a) preparing a first substrate and a second substrate, a surface of each of the first substrate and the second substrate including a conductive layer and an insulating layer;

(b) exposing each of the first substrate and the second substrate to a plasma to clean surfaces of the conductive layer and the insulating layer;

(c) selectively forming a film on the cleaned surface of at least one of the conductive layer or the insulating layer in each of the first substrate and the second substrate; and (d) bonding the conductive layer of the second substrate to the conductive layer of the first substrate to form a bonded body.

15. The method for substrate bonding according to claim 14, further comprising:

(e) heat-treating the bonded body formed in (d).

16. The method for substrate bonding according to claim 14, wherein (b) to (e) are performed without an exposure to the atmosphere.

17. The method for substrate bonding according to claim 14, wherein (c) includes forming an insulating film on the cleaned surface of the insulating layer.

18. The method for substrate bonding according to claim 14, wherein (c) includes forming a self-assembled monolayer film (SAM) on the cleaned surface of the conductive layer, and forming an insulating film on the cleaned surface of the insulating layer.

19. The method for substrate bonding according to claim 14, wherein (c) includes forming a metal film on the cleaned surface of the conductive layer.

20. The method for substrate bonding according to claim 14, wherein (c) includes forming a self-assembled monolayer film (SAM) on the cleaned surface of the insulating layer, and forming a metal film on the cleaned surface of the conductive layer.

21. A substrate bonding system comprising:

a surface treatment module configured to perform plasma processing on surfaces of a first substrate and a second substrate;

a deposition module coupled to the surface treatment module such that at least one of the first substrate or the second substrate is transferred to the deposition module without being exposed to atmosphere, the deposition module being configured to perform a deposition process on the surface of the at least one substrate; and a bonding module coupled to the deposition module such that the first substrate and the second substrate are transferred to the bonding module without exposing the first substrate and the second substrate to the atmosphere, the bonding module being configured to electrically bond the first substrate and the second substrate to each other to form a bonded body.

* * * * *